(12) United States Patent
Nowak et al.

(10) Patent No.: US 8,294,240 B2
(45) Date of Patent: Oct. 23, 2012

(54) THROUGH SILICON VIA WITH EMBEDDED DECOUPLING CAPACITOR

(75) Inventors: Matthew Michael Nowak, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 283 days.

(21) Appl. No.: 12/479,885

(22) Filed: Jun. 8, 2009

(65) Prior Publication Data

US 2010/0308435 A1  Dec. 9, 2010

(51) Int. Cl.
*H01L 29/92* (2006.01)

(52) U.S. Cl. ......... 257/532; 257/534; 257/E29.343; 257/E29.346; 257/E21.008; 438/386

(58) Field of Classification Search ......... 257/532, 257/534, 686, E29.343, E29.346, E21.008; 438/386
See application file for complete search history.

(56) References Cited

U.S. PATENT DOCUMENTS

| | | | | |
|---|---|---|---|---|
| 5,122,924 A * | 6/1992 | Okumura | | 361/330 |
| 5,682,062 A * | 10/1997 | Gaul | | 257/686 |
| 5,814,889 A * | 9/1998 | Gaul | | 257/773 |
| 6,002,177 A * | 12/1999 | Gaynes et al. | | 257/774 |
| 6,437,385 B1 * | 8/2002 | Bertin et al. | | 257/301 |
| 6,897,552 B2 * | 5/2005 | Nakao | | 257/686 |
| 6,963,483 B2 * | 11/2005 | Chakravorty et al. | | 361/306.3 |
| 7,157,372 B1 * | 1/2007 | Trezza | | 438/675 |
| 2002/0036338 A1 * | 3/2002 | Matsuo et al. | | 257/686 |
| 2004/0084751 A1 * | 5/2004 | Stern | | 257/531 |
| 2005/0106845 A1 * | 5/2005 | Halahan et al. | | 438/576 |
| 2006/0001174 A1 | 1/2006 | Matsui | | |
| 2008/0113505 A1 | 5/2008 | Sparks | | |
| 2009/0267183 A1 * | 10/2009 | Temple et al. | | 257/532 |
| 2010/0110607 A1 * | 5/2010 | DeNatale et al. | | 361/311 |
| 2010/0171209 A1 * | 7/2010 | Tanie et al. | | 257/686 |

FOREIGN PATENT DOCUMENTS

JP  01179443 A * 7/1989

OTHER PUBLICATIONS

International Search Report—PCT/US2010/037798, International Search Authority—European Patent Office Aug. 20, 2010.
Written Opinion—PCT/US2010/037798, International Search Authority—European Patent Office Aug. 20, 2010.

* cited by examiner

*Primary Examiner* — Allan R Wilson
(74) *Attorney, Agent, or Firm* — Sam Talpalatsky; Nicholas J. Pauley; Jonathan T. Velasco

(57) ABSTRACT

A semiconductor die, having a substrate, includes a through silicon via. The through silicon via includes a decoupling capacitor having a first co-axial conductor, a second co-axial conductor, and a co-axial dielectric separating the first co-axial conductor from the second co-axial conductor. The decoupling capacitor is configured to provide local charge storage for components on the semiconductor die.

16 Claims, 21 Drawing Sheets

THROUGH SILICON VIA WITH EMBEDDED DECOUPLING CAPACITOR

TECHNICAL FIELD

The present disclosure generally relates to integrated circuits (ICs). More specifically, the present disclosure relates to decoupling circuitry for ICs.

BACKGROUND

ICs are generally fabricated on one side of a semiconductor die. These dies are then used to power a diverse range of electronics products. IC packages conventionally include only one layer of ICs. Building multiple layers of ICs (or "stacking" the ICs) in the same semiconductor package can significantly reduce the lateral size of electronics and reduce the cost of manufacturing. As a result, stacked ICs are quickly gaining popularity for further extending the capabilities of electronics.

One feature used in building stacked ICs are through silicon vias (TSV). Through silicon vias are connections through the substrate of the die and may be used to connect a layer of ICs on one side of the substrate to an opposite side of the substrate where contacts may be provided for packaging the substrate. Through silicon vias occupy relatively small amounts of substrate area and do not otherwise interfere with circuitry built on the substrate thereby increasing the possible density of ICs. As the transistor density increases, the voltage supplied to the transistors decreases. These voltages are commonly smaller than the wall voltages available in most countries.

ICs are coupled to a voltage regulator that converts available wall voltages to the lower voltages used by the ICs. The voltage regulator ensures a predictable power supply is provided to the ICs. This is an important function because the tolerance of transistors to voltages under or over the target voltage is small. Only tenths of a volt lower may create erratic results in the ICs; only tenths of a volt higher may damage the ICs. As transistors in the ICs turn on and off, the power load changes rapidly placing additional demand on the voltage regulator. The distance between the voltage regulator and the ICs creates a long response time, preventing the voltage regulator from increasing power to the ICs instantaneously, especially when the transistors switch on and off millions or billions of times each second. Decoupling capacitors provide additional stability to the power supplied to ICs.

Decoupling capacitors attached in close proximity to ICs provide a local charge reservoir for the ICs. As demand on the power supply changes rapidly, the capacitor provides additional power and can refill at a later time when the power demand decreases. The decoupling capacitor allows ICs to operate at the high frequencies and computational speeds desired by consumers. However, as the transistor sizes have decreased and transistor densities increased, finding area on the ICs for decoupling capacitors has become difficult. Conventionally, capacitors are built from thick oxide transistors commonly used for I/O transistors. These capacitors are fabricated on the substrate to provide decoupling capacitance for the circuitry on the substrate. Thick oxide transistors offer very small values of capacitance in comparison to the large amounts of substrate area they consume that could otherwise be used for other circuitry.

Alternatively, through silicon vias may provide capacitance for decoupling. Through silicon vias include a conducting core and an insulating sleeve contained in a semiconductor substrate. If the conductor is connected to a supply voltage and the substrate is connected to a ground, then a capacitor is formed between the conducting core and the substrate. The capacitance is determined by the thickness of the insulator layer, the height of the through silicon vias, and the dielectric constant of the insulator layer. Generally, the dielectric constant is not easily changed. Therefore, the capacitance may be increased by decreasing the thickness of the insulating layer or increasing the height of the through silicon vias.

Semiconductor substrates experience charge depletion that creates an additional capacitance combined with the capacitance of the through silicon vias to form an effective capacitance. This effective capacitance will always be smaller than the smallest of the capacitance of the through silicon vias and the capacitance of the substrate. As a result, without changing the material of the substrate, only minor increases in effective capacitance may be gained from changing the design of through silicon vias.

Another type of via commonly found in ICs is a substrate or printed circuit board via. A substrate via is used to electrically couple several conductive layers in a printed circuit board substrate or packaging substrate. The vias are holes etched through the substrate that are plated with conductors and used to carry signals between layers. Multiple conductors may be plated in the vias separated by insulators to carry multiple signal lines through the via. However, these vias have low capacitance, if any. The insulator layer in the vias are thick (for example, 15-60 μm). The thickness prevents their use as decoupling capacitors. Additionally, depositing thin insulators with current techniques, namely lamination or build-up, is challenging.

Therefore, a new technique for providing decoupling of the circuitry from the die is needed that provides a higher degree of decoupling.

BRIEF SUMMARY

A semiconductor die includes a through silicon via having a capacitor. The capacitor has a first co-axial conductor, a second co-axial conductor, and a co-axial dielectric separating the first co-axial conductor from the second co-axial conductor.

A stacked IC includes a first die and a second die. The second die is coupled to the first die. The second die has a through silicon via including a capacitor. The capacitor includes a first co-axial conductor, a second co-axial conductor outside of the first co-axial conductor, and a first co-axial dielectric partially separating the first co-axial conductor from the second co-axial conductor.

A method of manufacturing an IC, having a substrate with a front side and a back side, includes fabricating openings for through silicon vias on the front side of the substrate. The method also includes depositing a first conductor in the through silicon vias. The method further includes depositing a dielectric on the first conductor. The method additionally includes depositing a second conductor on the dielectric.

A method of manufacturing a stacked IC, having a substrate with a front side and a back side, includes fabricating an opening for a through silicon via on the back side of the substrate. The method also includes depositing a first conductor in the through silicon via. The method further includes depositing a dielectric on the first conductor. The method additionally includes depositing a second conductor on the dielectric. The first conductor and the second conductor are configured as terminals of a decoupling capacitor.

A stacked IC having at least one die with a substrate includes the die having means for storing charge in close proximity to a component of the stacked IC. The means is located in an opening in the substrate The foregoing has outlined rather broadly the features and technical advantages of the present invention in order that the detailed description that follows may be better understood. Additional features and advantages will be described hereinafter that form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the technology of the invention as set forth in the appended claims. The novel features that are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following description taken in conjunction with the accompanying drawings.

DETAILED DESCRIPTION

One method for providing decoupling of ICs from the die is to build the decoupling capacitors into the through silicon vias. Through silicon vias are already well integrated into the manufacturing process for stacked ICs, and large numbers exist on stacked ICs. Building decoupling capacitors into the through silicon vias has several advantages.

Removing conventional separate decoupling capacitors from the substrate increases the die area available for active circuitry. The reduction in die size leads to smaller portable electronic devices. Additionally, building the decoupling capacitor into a structure that is already present in the die reduces manufacturing costs. Fewer processes are used to embed the decoupling capacitor in through silicon vias than to build a separate decoupling capacitor.

Figure 1:
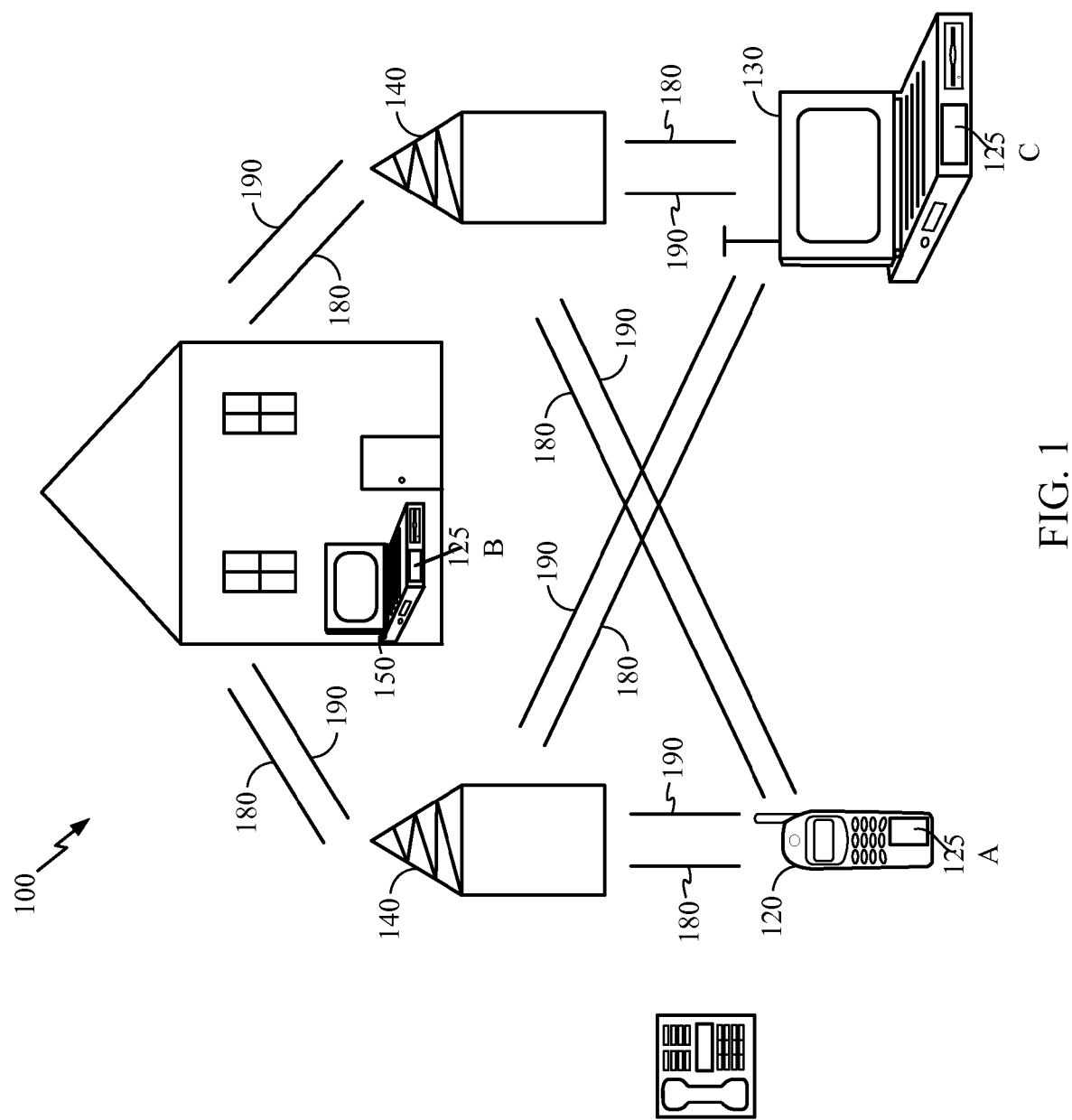
FIG. 1 is a block diagram showing an exemplary wireless communication system.

In FIG. 1, remote unit 120 is shown as a mobile telephone, remote unit 130 is shown as a portable computer, and remote unit 150 is shown as a fixed location remote unit in a wireless local loop system. For example, the remote units may be mobile phones, hand-held personal communication systems (PCS) units, portable data units such as personal data assistants, navigation devices (such as GPS enabled devices), set top boxes, music players, video players, entertainment units, fixed location data units such as meter reading equipment, or any other device that stores or retrieves data or computer instructions, or any combination thereof. Although FIG. 1 illustrates remote units according to the teachings of the disclosure, the disclosure is not limited to these exemplary illustrated units. Embodiments of the disclosure may be suitably employed in any device which includes active integrated circuitry including memory.

The foregoing disclosed devices and methods are typically designed and are configured into a hardware description language, such as GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Figure 2A:
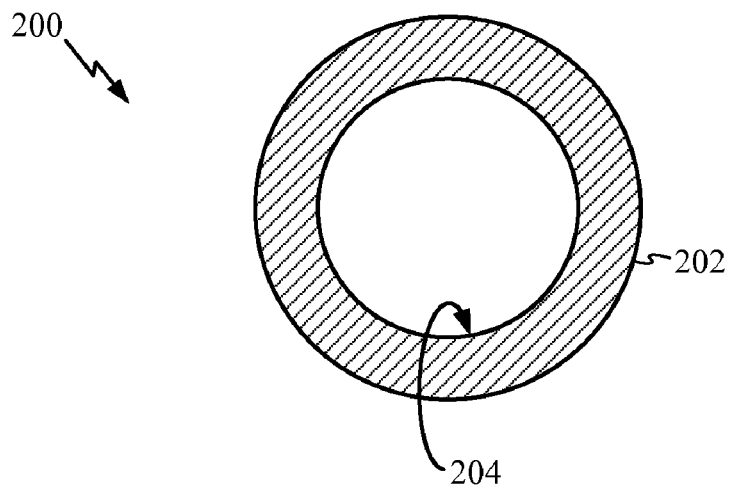
FIG. 2A is a drawing showing a top view of a conventional through silicon via.

Turning now to FIG. 2A, an illustration showing a conventional through silicon via is presented. A top view of a through silicon via 200 includes a conductor 204 surrounded by an insulator 202. The through silicon via 200 will now be presented in a perspective view and explained in further detail.

Figure 2B:
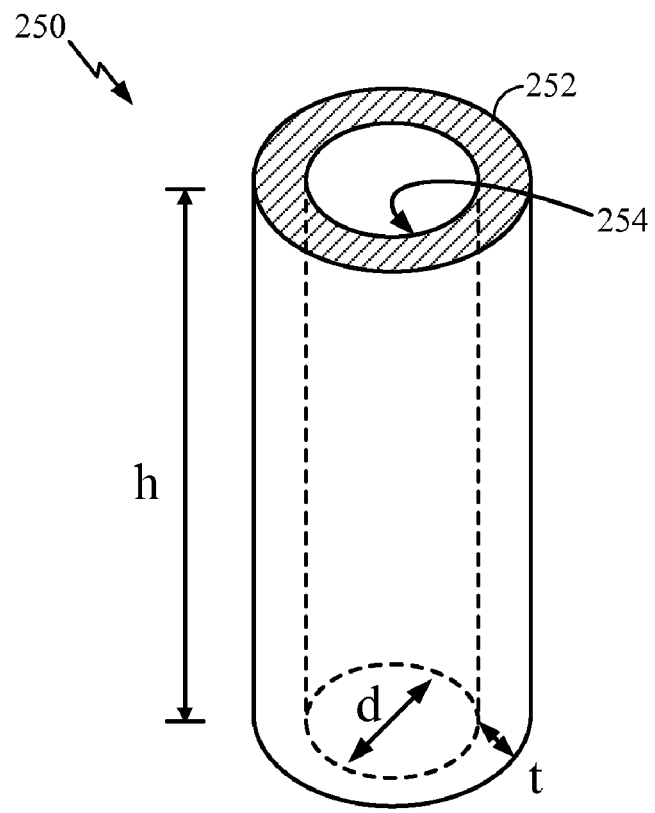
FIG. 2B is a drawing showing a perspective view of a conventional through silicon via.

FIG. 2B is an illustration showing a perspective view of a conventional through silicon via. A through silicon via 250 includes a conductor 254 that extends the length of the through silicon via 250. One possible use for the conductor 254 is to carry signals through the semiconductor substrate. The conductor 254 may be, for example, copper, aluminum, tungsten, or poly-silicon. The conductor 254 has a diameter, d. Surrounding the conductor 254 is an insulator 252. The insulator (also referred to as a dielectric) 252 extends the length of the through silicon via 250 to prevent shorting of the conductor 254 to a surrounding semiconductor die (not shown). The insulator 252 may be, for example, silicon dioxide or silicon nitride. The insulator 252 has a thickness, t. The total diameter of the through silicon via 250 is given by d+t.

Figure 3:
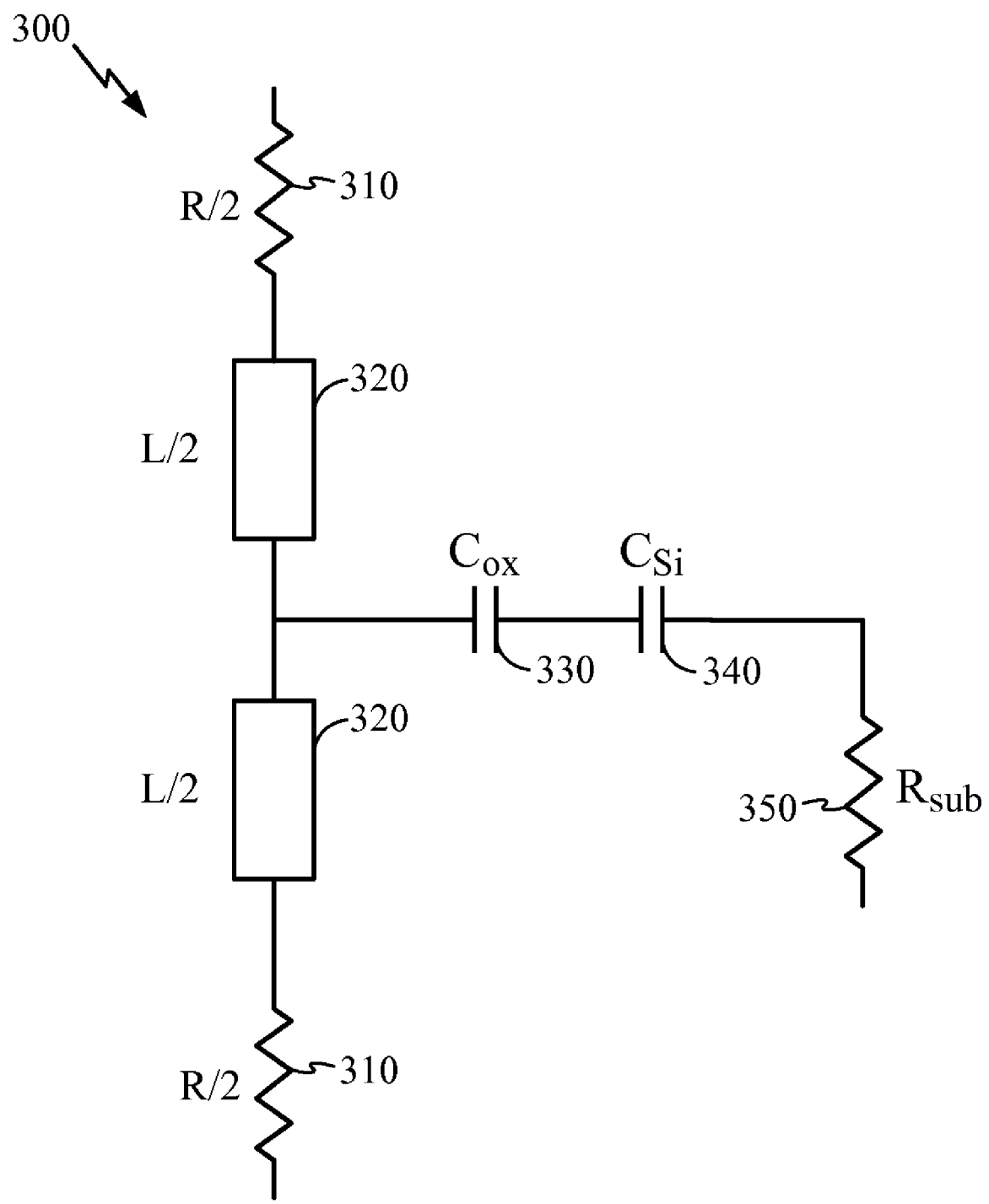
FIG. 3 is a circuit schematic illustrating an equivalent circuit for a through silicon via.

ICs built using the conventional through silicon via illustrated by FIG. 2B may be represented by an equivalent circuit for analysis. FIG. 3 is a circuit schematic illustrating an equivalent circuit for a conventional through silicon via. An equivalent circuit 300 includes capacitance of the insulator represented by a capacitor 330, with value $C_{ox}$, that is proportional to the thickness of the insulator 252. An additional capacitance arises as flow of charge carriers through the semiconductor substrate causes charge depletion. Depletion of charge in the semiconductor substrate is represented by a capacitor 340, with value $C_{Si}$. An effective capacitance representing all capacitances, $C_{eff}$, is a series combination of the capacitor 330 and the capacitor 340. Resistance along the conductor 254 is represented by a resistor 310, with value R. Inductance along the conductor 254 is represented by an inductor 320, with value L. Additionally, resistance of the semiconductor substrate is represented by a resistor 350 with value $R_{sub}$.

The effective capacitance, $C_{eff}$, of a series combination of the substrate capacitance, $C_{Si}$, and the insulator capacitance, $C_{ox}$, will always be smaller than the minimum of $C_{Si}$ and $C_{ox}$. The substrate capacitance, $C_{Si}$, is a fixed value based on the material used in the substrate. Changing the substrate material is not easily accomplished. Insulator capacitance, $C_{ox}$, can be changed through manufacturing design parameters, but has little impact on the effective capacitance, $C_{eff}$, because the substrate capacitance, $C_{Si}$, is commonly smaller than the insulator capacitance, $C_{ox}$. Therefore, it would be preferable to eliminate the substrate capacitance, $C_{Si}$, from the effective capacitance, $C_{eff}$. Additionally, the substrate resistance, $R_{sub}$, has a negative impact on the capacitance of the structure, and it would be preferable to eliminate $R_{sub}$ from the equivalent circuit. The embodiment that will be described below eliminates the substrate capacitance, $C_{Si}$, and the substrate resistance, $R_{sub}$, through the use of an additional conducting layer.

Figure 4A:
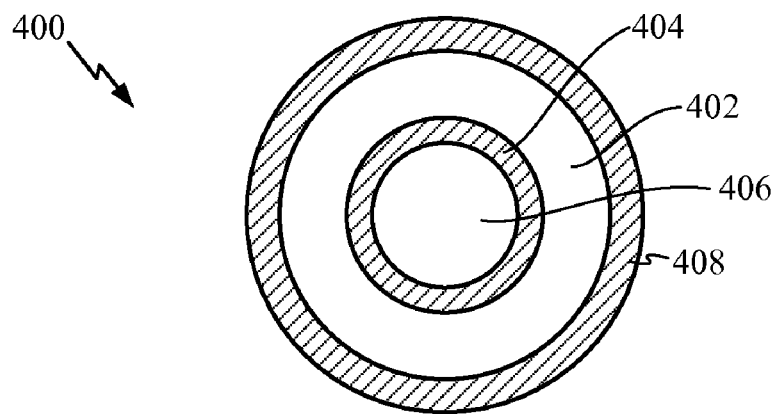
FIG. 4A is a drawing showing a top view of an exemplary through silicon via with decoupling capacitor according to one embodiment.

Turning now to FIG. 4A, a decoupling capacitor embedded in a through silicon via will be discussed. FIG. 4A is an illustration showing an exemplary through silicon via with a decoupling capacitor according to one embodiment. A top view of a through silicon via 400 includes a first conductor 406 surrounded by a first insulator 404. The through silicon via further includes a second conductor 402 surrounding the first insulator 404 and a second insulator 408 surrounding the second conductor 402. The through silicon via 400 will now be presented in a perspective view and explained in further detail.

Figure 4B:
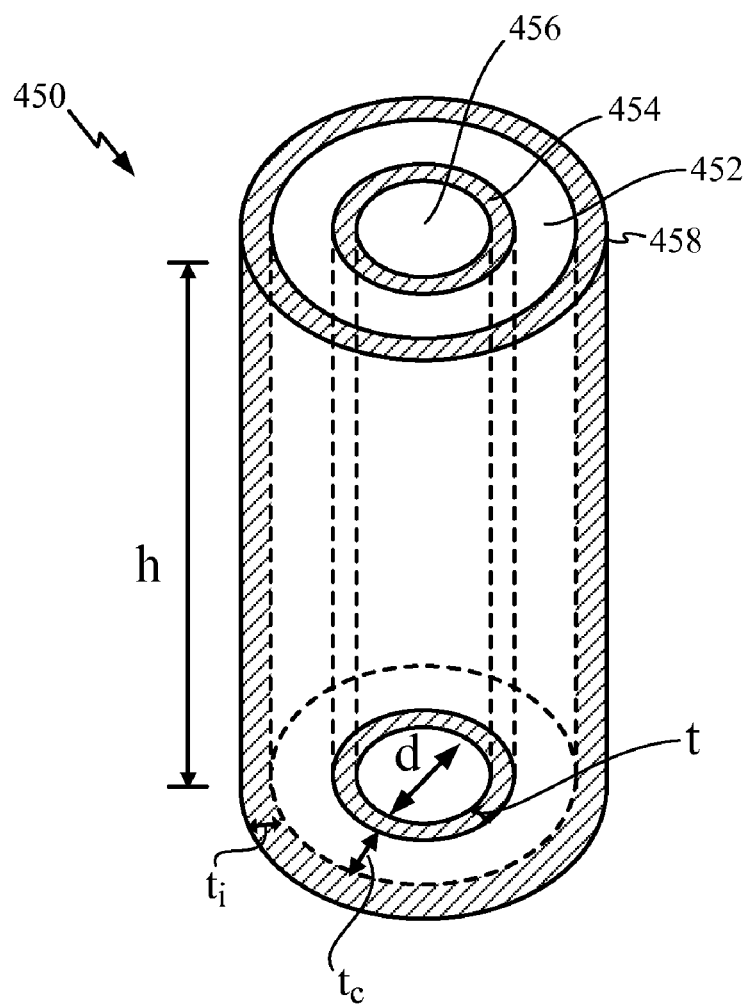
FIG. 4B is a drawing showing a perspective view of an exemplary through silicon via with decoupling capacitor according to one embodiment.

FIG. 4B is a perspective view of an exemplary through silicon via according to one embodiment. A through silicon via 450 includes a first conductor 456 that extends the length of the through silicon via 450. The first conductor 456 has a diameter, d. A second conductor 452 is shown as the outer annulus and stretches the length of the through silicon via 450. The second conductor 452 has a thickness, $t_c$. According to one embodiment, the second conductor 452 and the first conductor 456 carry signals through a semiconductor substrate (not shown). The second conductor 452 may be copper or a refractory metal. The first conductor 456 may be, for example, copper, aluminum, tungsten, or poly-silicon. Surrounding the first conductor 456 is a first insulator 454 to prevent shorting of the first conductor 456 to the second conductor 452. The first insulator 454 has a thickness, t. Surrounding the second conductor 452 is a second insulator 458. The second insulator 458 has a thickness, $t_i$, and is useful to prevent shorting of the second conductor 452 with a surrounding semiconductor die (not shown). The first insulator 454 and the second insulator 458 may be, for example, silicon oxide or silicon nitride. In one embodiment, the first insulator 454 has a high dielectric constant, such as that of silicon nitride. The first conductor 456, the first insulator 454, and the second conductor 452 form a capacitor, that according to one embodiment, decouples circuitry from a semiconductor die (not shown).

The capacitor embedded in the through silicon via 450 includes the conductors 452, 456. As a result, current flow in the through silicon via 450 no longer results in electron flow through the semiconductor substrate. Addition of the second conductor 452 reduces or eliminates the substrate capacitance, $C_{Si}$. As a result, the effective capacitance, $C_{eff}$, of the structure equals the value of the oxide capacitance, $C_{ox}$. Further, the substrate resistance, $R_{sub}$, is reduced or eliminated because the electrons no longer flow through the substrate.

A sample calculation for the conventional and exemplary through silicon via will now be compared. For example, if a through silicon via is constructed with a diameter of 6 μm and a height of 50 μm, then the capacitance, $C_{ox}$, of the oxide (with a thickness of 200 nm) is approximately 190 femtoFarads. The capacitance of the substrate, $C_{Si}$, is approximately 140 femtoFarads resulting in an effective capacitance, $C_{eff}$, of approximately 80 femtoFarads. The area, A, occupied by the through silicon via of these dimensions is approximately 30 μm². Therefore the capacitance per area, $C_{eff}/A$, is approximately 3000 nF/μm² in a conventional through silicon via. However, adding the second conductor 452 removes $C_{Si}$ from the effective capacitance, resulting in a capacitance per area of $C_{ox}/A$ that is approximately double $C_{eff}/A$, or 6000 nF/μm². Conventional thick oxide transistor decoupling capacitors commonly have a capacitance per area of 10 nF/μm². Therefore, the capacitance per area increase resulting from embedding a decoupling capacitor in a through silicon via is larger than other decoupling solutions available.

Figure 5:
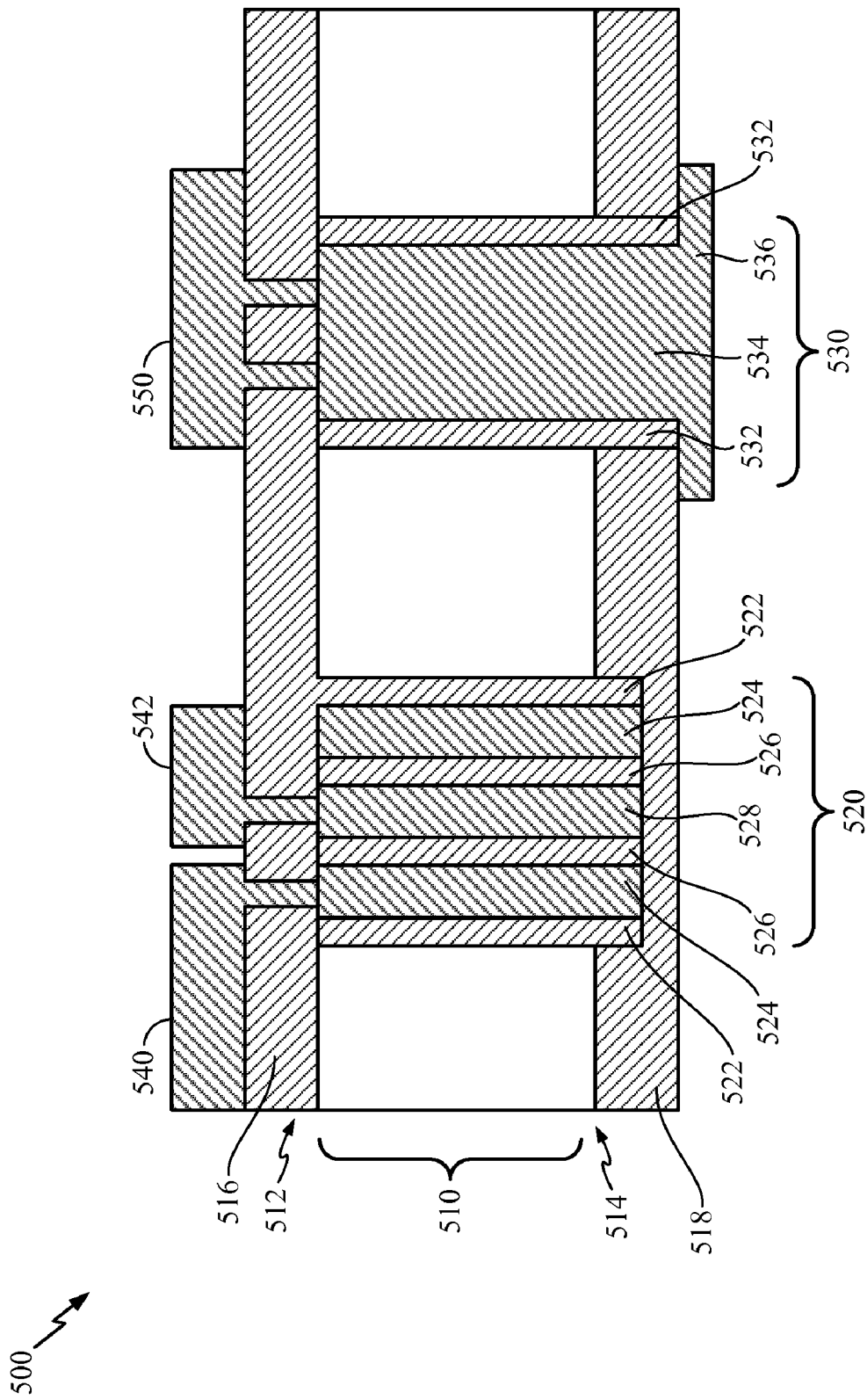
FIG. 5 is a cross section showing an exemplary die configuration according to one embodiment.

Turning now to FIG. 5, the exemplary through silicon via of FIG. 4 is shown integrated into a semiconductor die. FIG. 5 is a cross section showing an exemplary die configuration according to one embodiment. A fabricated die 500 shown in its cross section includes a substrate 510. The substrate 510 has a front side 512 and a back side 514. The front side 512 may contain active circuitry and can be coated by a protective layer 516 that may be, for example, silicon nitride or silicon oxide. Similarly, the back side 514 is coated by a protective layer 518. Contained within the substrate 510 are a through silicon via with an embedded decoupling capacitor 520 and a through silicon via without an embedded decoupling capacitor 530 manufactured using a single fabrication process. Although only two through silicon vias are shown here, a fabricated die may include many more through silicon vias. Additionally, although only one substrate is shown here, a stacked IC may contain many more substrates.

The through silicon via 530 includes a first conductor 534 and a first insulator 532. The first conductor 534 couples to a contact pad 536 on the back side 514. The first conductor 534 also couples to a contact pad 550 on the front side 512. The through silicon via 530 is manufactured during the same process as the through silicon via 520, according to one embodiment. The through silicon via 530 is useful to convey signals from the contact pad 550 to the contact pad 536. According to one embodiment, it may be used similarly to a conventional through silicon via.

The through silicon via 520 includes an embedded decoupling capacitor as shown in FIG. 4. A first conductor 528 extends the length of the through silicon via 520. Surrounding the first conductor 528 is a first insulator 526. Surrounding the first insulator 526 is a second conductor 524 separated from the first conductor 528. Surrounding the second conductor 524 is a second insulator 522 that separates the second conductor 524 from the substrate 510. Coupled to the second conductor 524 is a contact pad 540. Similarly, coupled to the first conductor 528 is a contact pad 542. A capacitor is formed with the first conductor 528 and the second conductor 524; the contact pad 540 and the contact pad 542 act as connections to two terminals of a capacitor.

Figure 6:
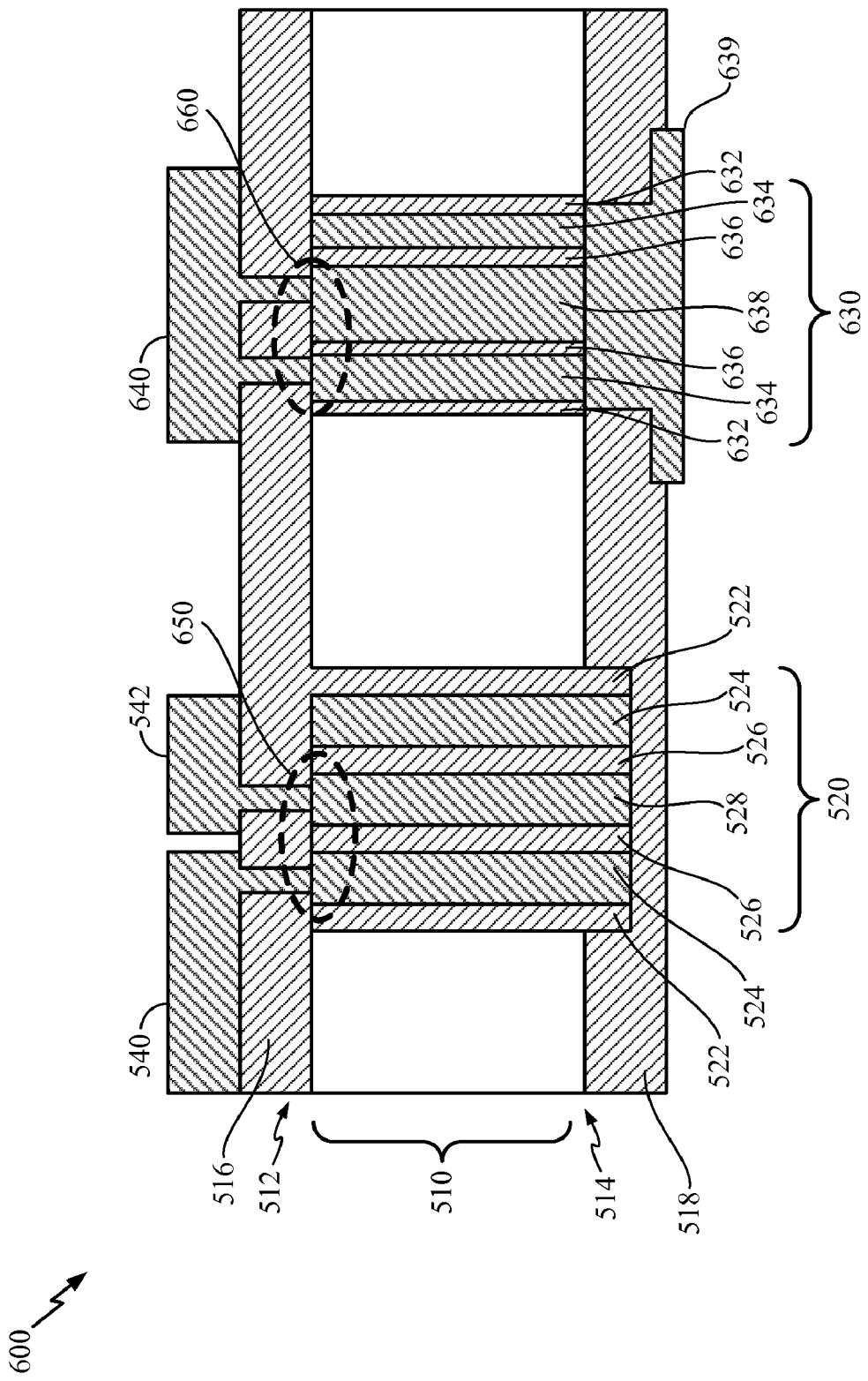
FIG. 6 is a cross section showing an alternative exemplary die configuration according to one embodiment.

One alternative to the die configuration of FIG. 5 includes constructing all through silicon vias to include multiple conductors. FIG. 6 is a cross section showing an alternative exemplary die configuration according to one embodiment. A fabricated die 600 includes the substrate 510 configured similarly to that of FIG. 5. Additionally, the fabricated die 600 includes a through silicon via 630. The through silicon via 630 includes an exemplary decoupling capacitor as illustrated in FIG. 4. The through silicon via 630 includes a first conductor 638 and a second conductor 634 separated by a first insulator 636. The second conductor 634 is separated from the substrate 510 by a second insulator 632. A contact pad 639 couples to the second conductor 634 and the first conductor 638 on the back side 514. Additionally, a contact pad 640 couples to the second conductor 634 and the first conductor 638 on the front side 512. In this configuration, the second conductor 634 and the first conductor 638 are short-circuited. At a region 660 the contact pad 640 is coupled to the first conductor 638 and the second conductor 634. At a region 650 the contact pad 540 is coupled to the second conductor 524 and the contact pad 542 is coupled to the first conductor 528. The through silicon via 630 may be used, for example, to convey signals from the front side 512 to the back side 514.

Although the through silicon via 630 in FIG. 6 serves the same purpose as the through silicon via 530 in FIG. 5, manufacturing of the fabricated die 600 involves fewer processes than the fabricated die 500. However, the through silicon via 630 has lower conductance than the through silicon via 530 as a result of the first insulator 636.

At least two processes may be used to manufacture through silicon vias. The first, known as via first, involves creating the via in the substrate during wafer fabrication before or after front end of line device fabrication. The second, known as via last, involves creating the via in the substrate after fabricating active circuitry on the substrate. Each process has its own advantages and disadvantages. One method of fabricating the embedded decoupling capacitor will be illustrated for the via first process, and one method will be illustrated for the via last process.

Figure 7:
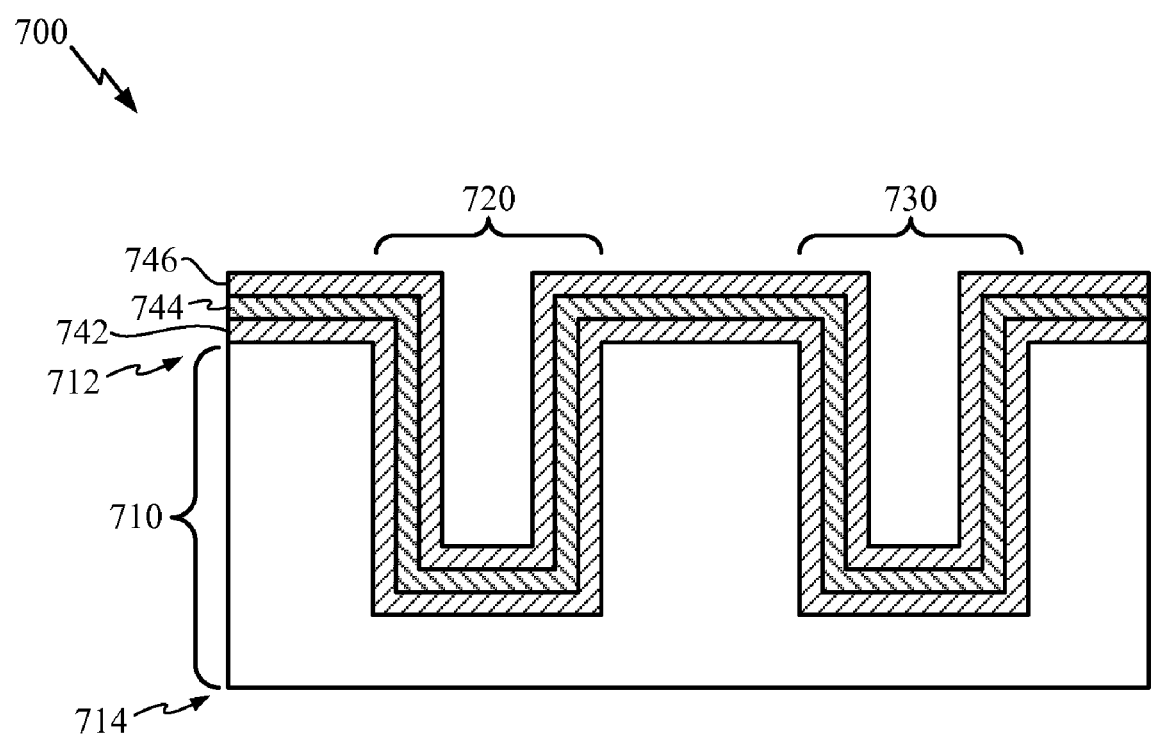
FIG. 7 is a cross section showing an exemplary die configuration after a first manufacturing process in a via first processing technique according to one embodiment.

Turning now to FIG. 7, an exemplary via first process for manufacturing through silicon vias with embedded decoupling capacitors will be demonstrated. FIG. 7 is a cross section showing an exemplary die configuration after a first manufacturing process in a via first processing technique according to one embodiment. A die 700 includes a substrate 710 having a front side 712 and a back side 714. A through silicon via 720 and a through silicon via 730 are formed by etching the front side 712. Etching may include, for example, wet etching or dry etching. Afterwards, three conformal layers are deposited on the front side 712. A first insulator 742 is deposited, followed by a first conductor 744, and a second insulator 746.

Figure 8:
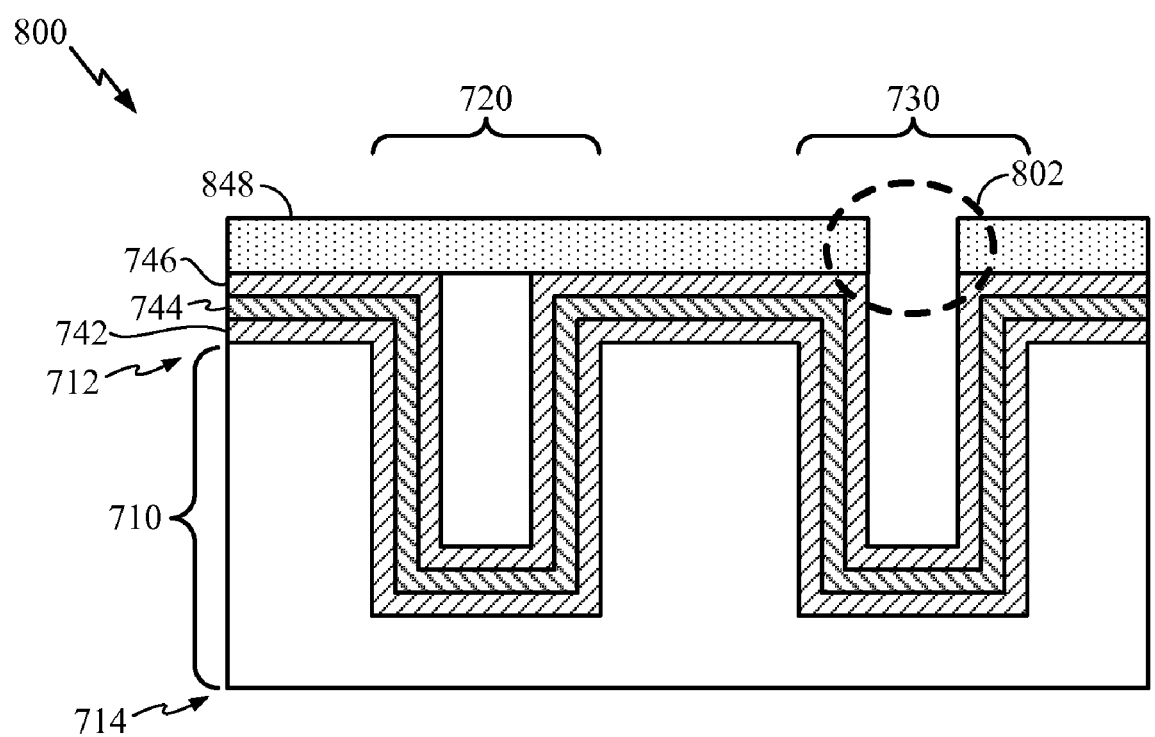
FIG. 8 is a cross section showing an exemplary die configuration after a second manufacturing process in a via first processing technique according to one embodiment.

Turning now to FIG. 8, additional processes are performed in the fabrication of the through silicon vias. FIG. 8 is a cross section showing an exemplary die configuration after a second manufacturing process in a via first processing technique according to one embodiment. A die 800 includes a sacrificial layer 848 deposited on the front side 712. A section of the sacrificial layer 848 above the through silicon via 730 at a region 802 is removed. The sacrificial layer 848 may be, for example, a photoresist material. The region 802 may be cleared of the photoresist by exposure to an appropriate light source and development.

Figure 9:
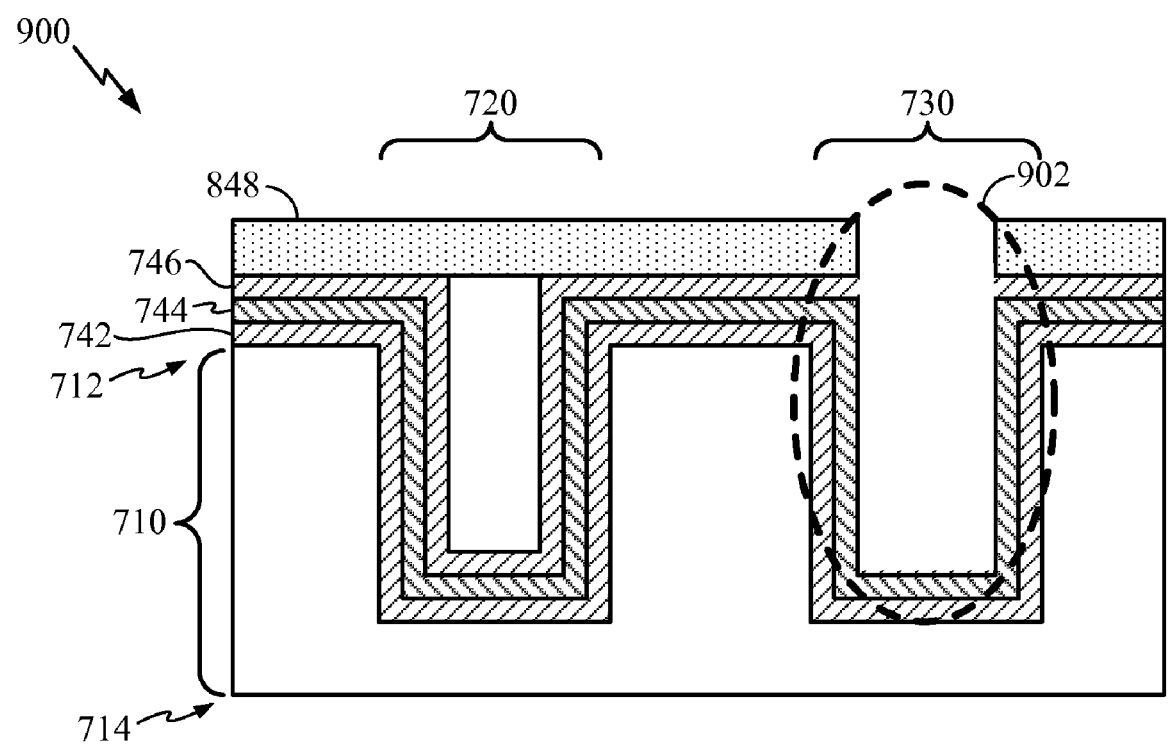
FIG. 9 is a cross section showing an exemplary die configuration after a third manufacturing process in a via first processing according to one embodiment.

Turning now to FIG. 9, additional processes are performed in the fabrication of the through silicon vias. FIG. 9 is a cross section showing an exemplary die configuration after a third manufacturing process in a via first processing technique according to one embodiment. A die 900 has etching performed through the opening over the through silicon via 730 to remove a section of the second insulator 746. A region 902 demonstrates the through silicon via 730 after etching of the second insulator 746.

Figure 10:
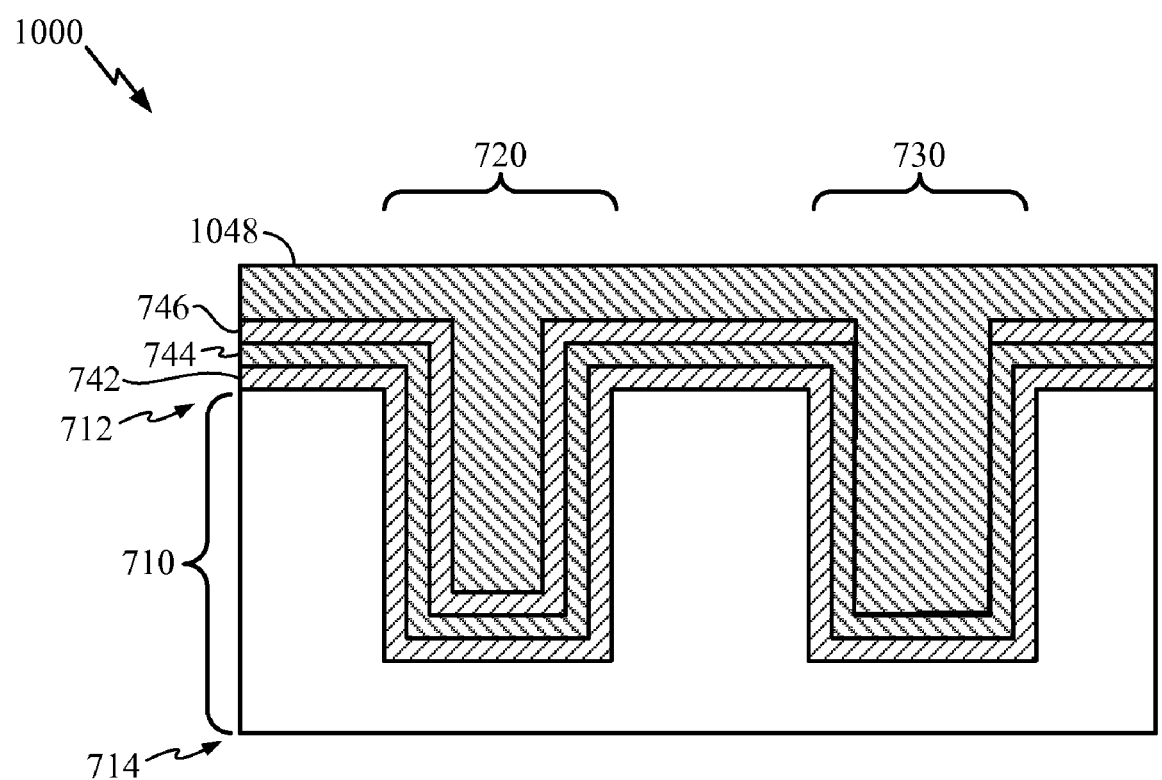
FIG. 10 is a cross section showing an exemplary die configuration after a fourth manufacturing process in a via first processing technique according to one embodiment.

Turning now to FIG. 10, additional processes are performed in the fabrication of the through silicon vias. FIG. 10 is a cross section showing an exemplary die configuration after a fourth manufacturing process in a via first processing technique according to one embodiment. A die 1000 has the sacrificial layer 848 removed. A second conductor 1048 has been deposited on the front side 712 and fills the through silicon via 720 and the through silicon via 730.

Figure 11:
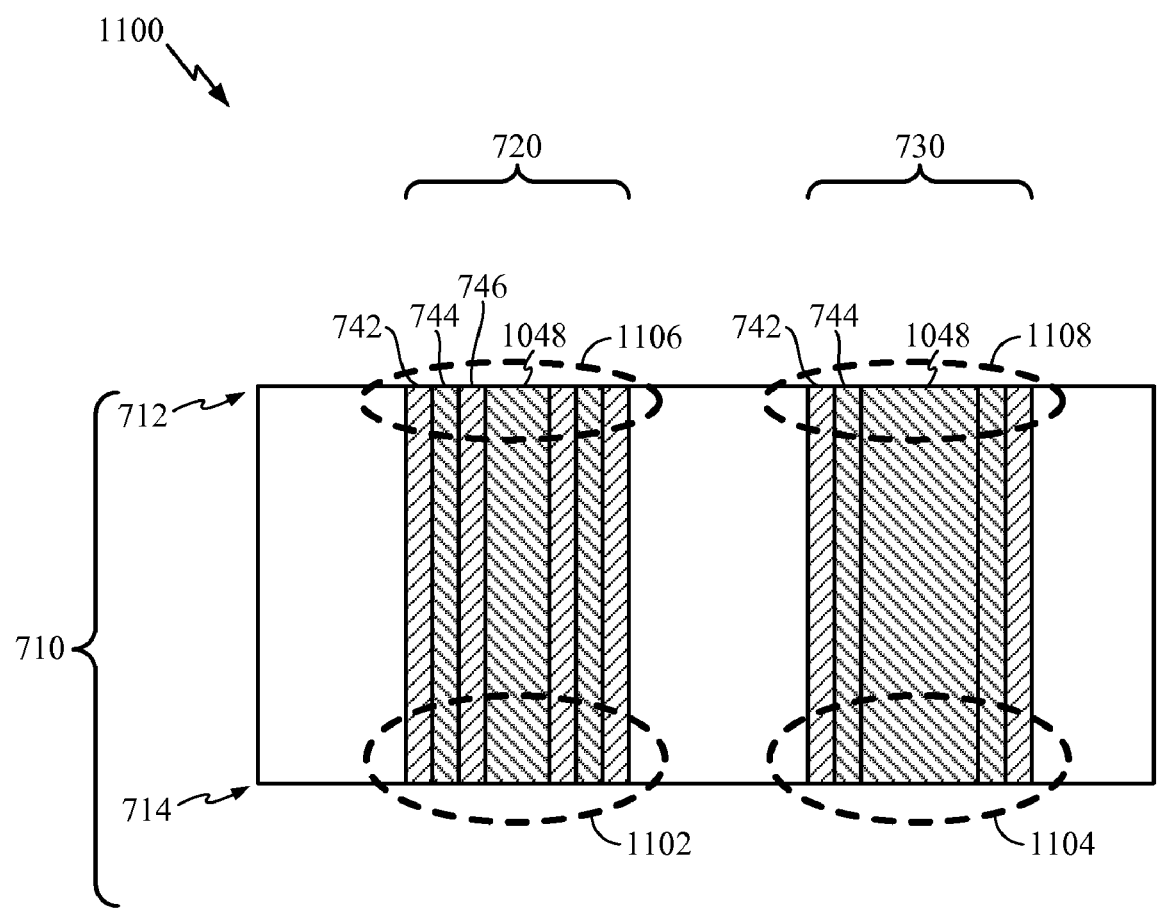
FIG. 11 is a cross section showing an exemplary die configuration after a fifth manufacturing process in a via first processing technique according to one embodiment.

Turning now to FIG. 11, additional processes are performed in the fabrication of the through silicon vias. FIG. 11 is a cross section showing an exemplary die configuration after a fifth manufacturing process in a via first processing technique according to one embodiment. A die 1100 has been polished on the front side 712 to expose contact points at a region 1106 for the through silicon via 720 and at a region 1108 for the through silicon via 730. Additionally, the back side 714 has been polished to expose contact points at a region 1102 for the through silicon via 720 and at a region 1104 for the through silicon via 730.

Figure 12:
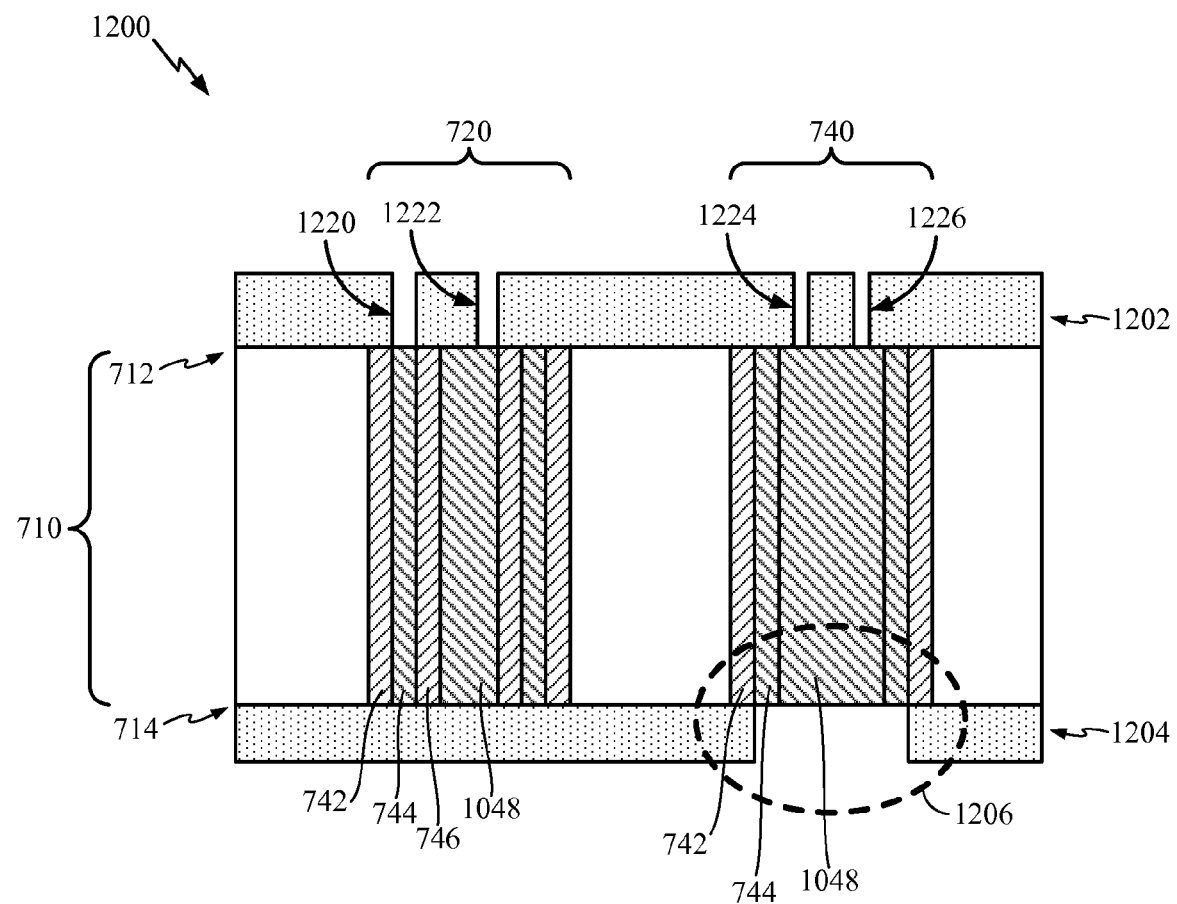
FIG. 12 is a cross section showing an exemplary die configuration after a sixth manufacturing process in a via first processing technique according to one embodiment.

Turning now to FIG. 12, additional processes are performed in the fabrication of the through silicon vias. FIG. 12 is a cross section showing an exemplary die configuration after a sixth manufacturing process in a via first processing technique according to one embodiment. A die 1200 includes an insulator 1202 deposited on the front side 712 and an insulator 1204 deposited on the back side 714. An opening 1220 is made in the insulator 1202 to expose the first conductor 744 and an opening 1222 is made to expose the second conductor 1048. Additionally, an opening 1224 and an opening 1226 are made in the insulator 1202. The insulator 1204 is removed in a region 1206 to expose the through silicon via 740.

Figure 13:
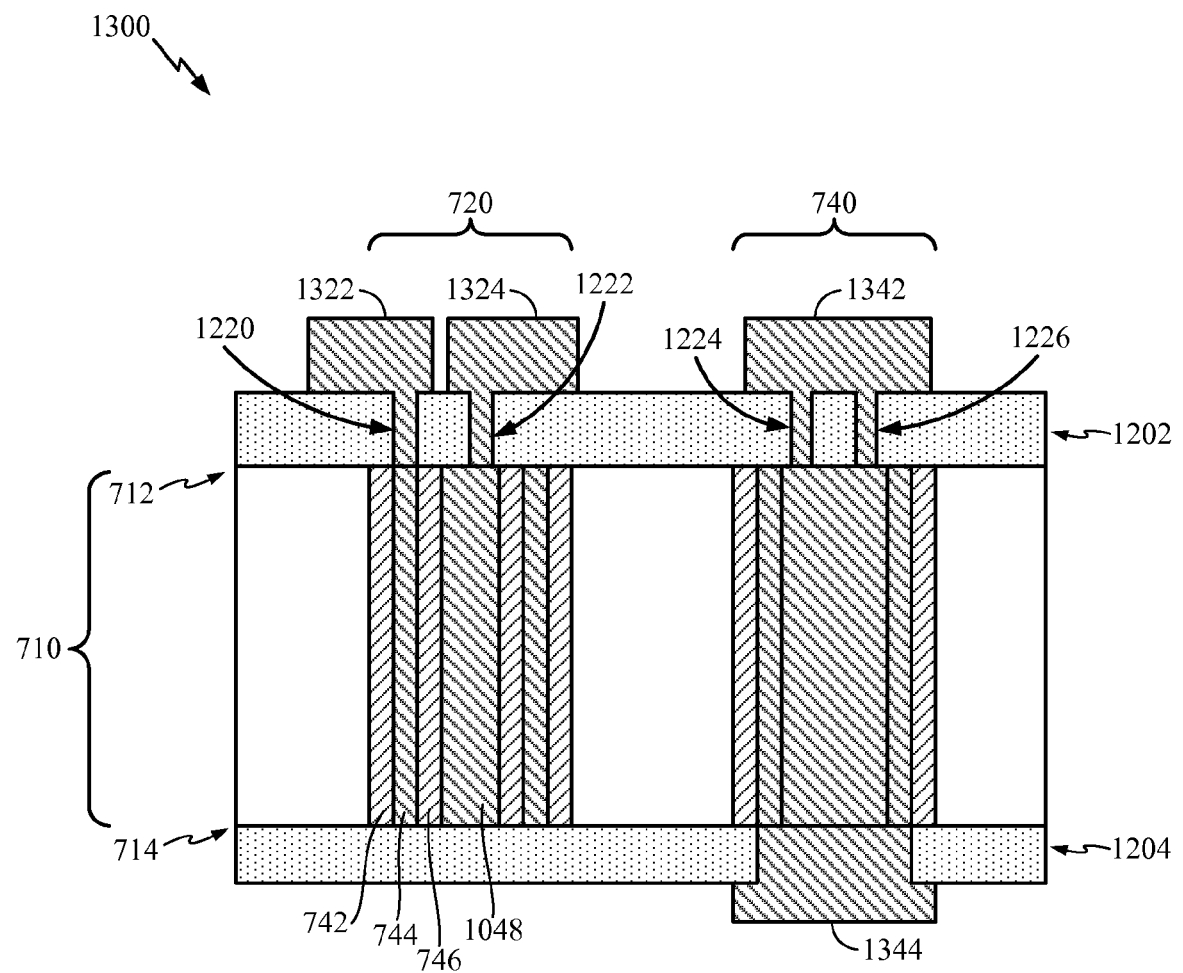
FIG. 13 is a cross section showing an exemplary die configuration after a seventh manufacturing process in a via first processing technique according to one embodiment.

Turning now to FIG. 13, additional processes are performed in the fabrication of the through silicon vias. FIG. 13 is a cross section showing an exemplary die configuration after a seventh manufacturing process in a via first processing technique according to one embodiment. A die 1300 includes a contact pad 1322 and a contact pad 1324 deposited to contact the first conductor 744 through the opening 1220 and the second conductor 1048 through the opening 1222, respectively. A capacitor is formed between the first conductor 744 and the second conductor 1048. The contact pad 1322 and the contact pad 1324 act as connections to two terminals of a capacitor. Additionally, a contact pad 1342 and a contact pad 1344 are deposited to contact the through silicon via 740. The through silicon via 740 may be used, for example, to convey signals between the front side 712 and the back side 714.

One embodiment of the disclosure in which through silicon vias are fabricated using a via first process has been described. In via first processing, the through silicon vias are fabricated before or after front end of line device fabrication. Alternatively, in via last processing the through silicon vias are fabricated after other circuitry on the substrate. In another embodiment of the disclosure, the through silicon vias with embedded decoupling capacitors are fabricated using a via last process. Through silicon vias manufactured using the via first process can be packed much more densely than through silicon vias manufactured using the via last process. Therefore, the via first process commonly has a larger number of through silicon vias with embedded decoupling capacitors creating better decoupling of the circuitry on the substrate.

Figure 14:
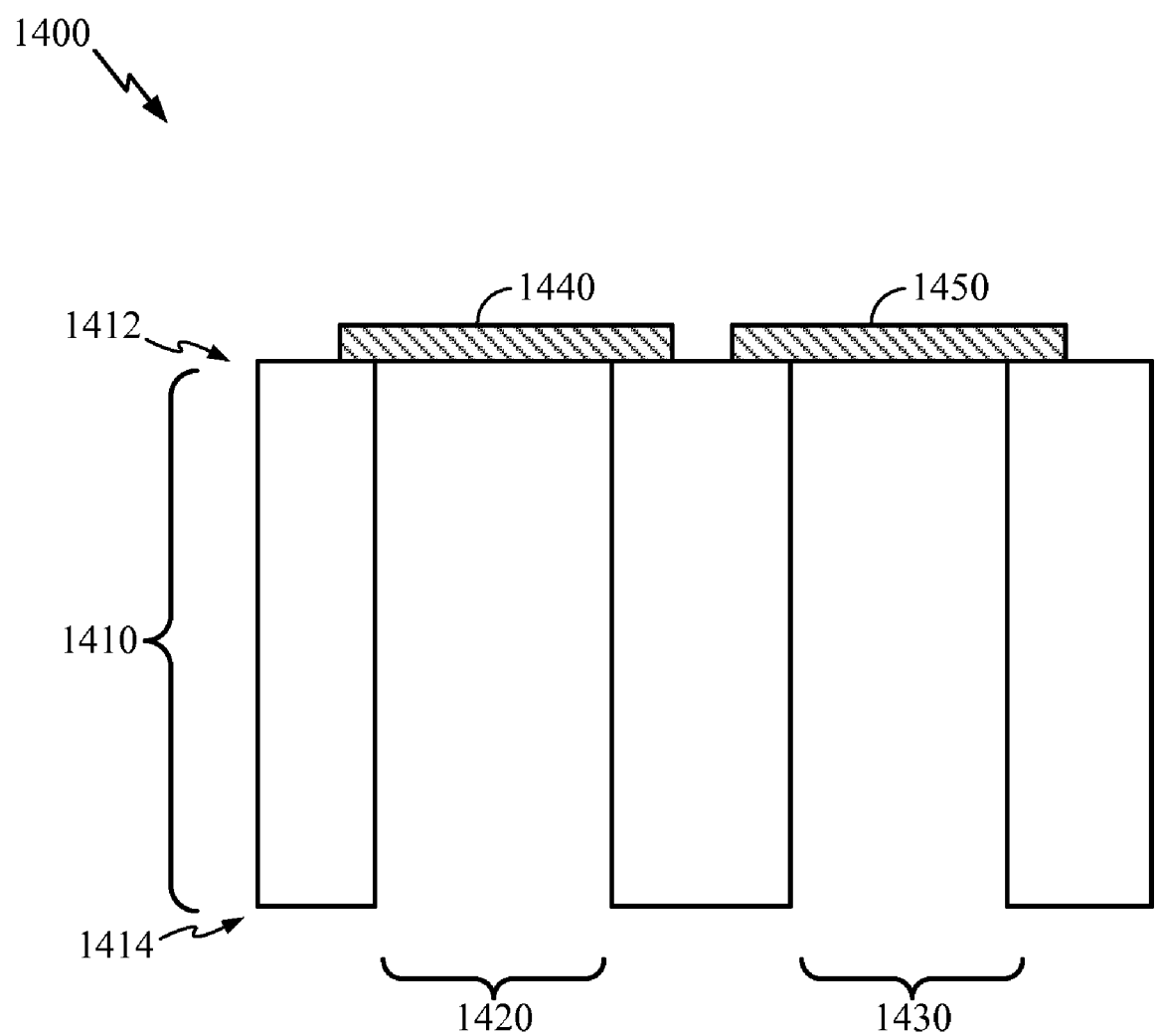
FIG. 14 is a cross section showing an exemplary die configuration after a first manufacturing process in a via last processing technique according to one embodiment.

FIG. 14 is a cross section showing an exemplary die configuration after a first manufacturing process in a via last processing technique according to one embodiment. A die 1400 includes a substrate 1410 with a front side 1412 and a back side 1414. The front side 1412 includes a contact pad 1440 and a contact pad 1450. Although only the contact pad 1440 and the contact pad 1450 are shown, the front side 1412 may contain other circuitry. The back side 1414 includes a through silicon via 1420 and a through silicon via 1430. The through silicon via 1420 and the through silicon via 1430 are etched after fabrication of circuitry (not shown) on the front side 1412 has completed.

Figure 15:
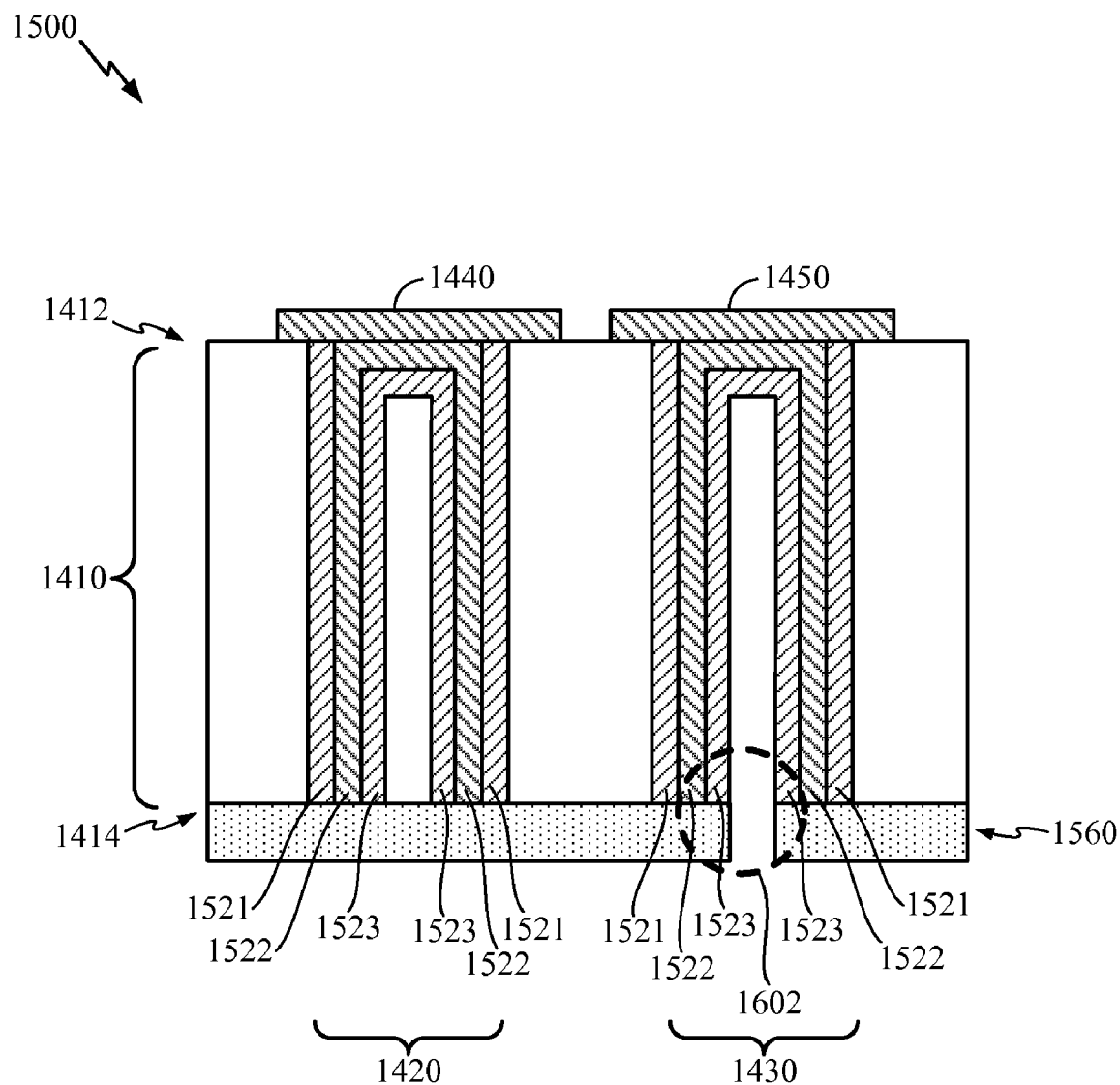
FIG. 15 is a cross section showing an exemplary die configuration after a second manufacturing process in a via last processing technique according to one embodiment.

Turning now to FIG. 15, fabrication of the through silicon vias with embedded decoupling capacitors continues. FIG. 15 is a cross section showing an exemplary die configuration after a second manufacturing process in a via last processing technique according to one embodiment. Deposited on the back side 1414 is a first insulator layer 1521. The first insulator layer 1521 is useful to prevent short circuiting of the through silicon via 1420 and the through silicon via 1430 with the substrate 1410. The first insulator layer 1521 coats sidewalls of the through silicon via 1420 and the through silicon via 1430. Additionally a conformal coating of a first conducting layer 1522 and a second insulating layer 1523 are deposited in the through silicon via 1420 and the through silicon via 1430. Next, a sacrificial layer 1560 is deposited on the back side 1414 and an opening above the through silicon via 1430 is etched at a region 1602. The sacrificial layer 1560 is used to mask the back side 1414 so that etching of the second insulator layer 1523 only affects certain through silicon vias. After etching of the second insulator layer 1523 occurs, the sacrificial layer 1560 may be removed.

Figure 16:
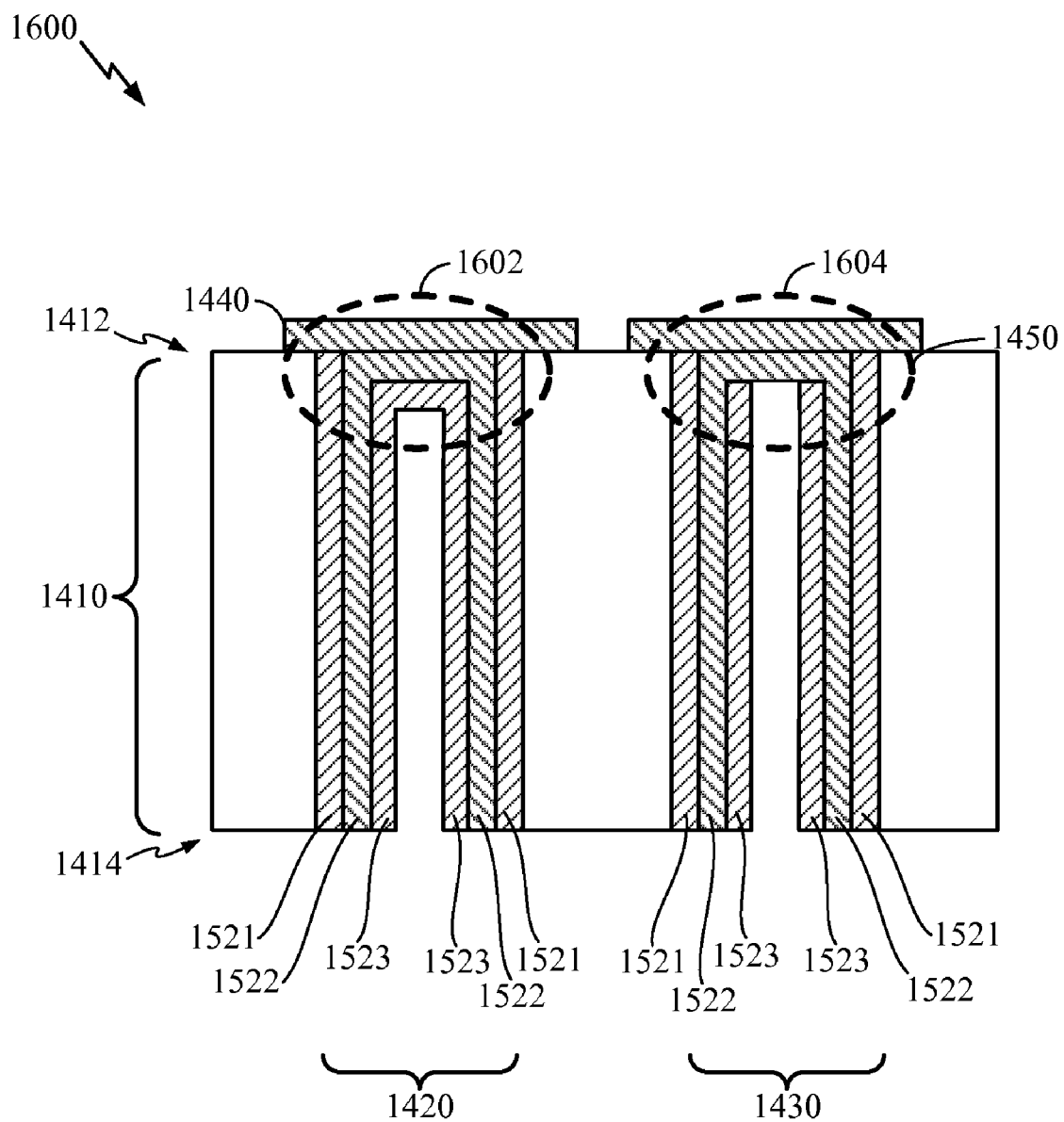
FIG. 16 is a cross section showing an exemplary die configuration after a third manufacturing process in a via last processing technique according to one embodiment.

Turning now to FIG. 16, the results of the etch are shown. FIG. 16 is a cross section showing an exemplary die configuration after a third manufacturing process in a via last processing technique according to one embodiment. After etching of the second insulator layer 1523 is carried out, the section of the second insulator layer 1523 at the bottom of any through silicon vias that are not masked by the sacrificial layer 1560 are removed. At a region 1604 the second insulator layer 1523 at the bottom of the through silicon via 1430 has been removed. In contrast, at a region 1602 the second insulator layer 1523 remains intact at the bottom of the through silicon via 1420.

Figure 17:
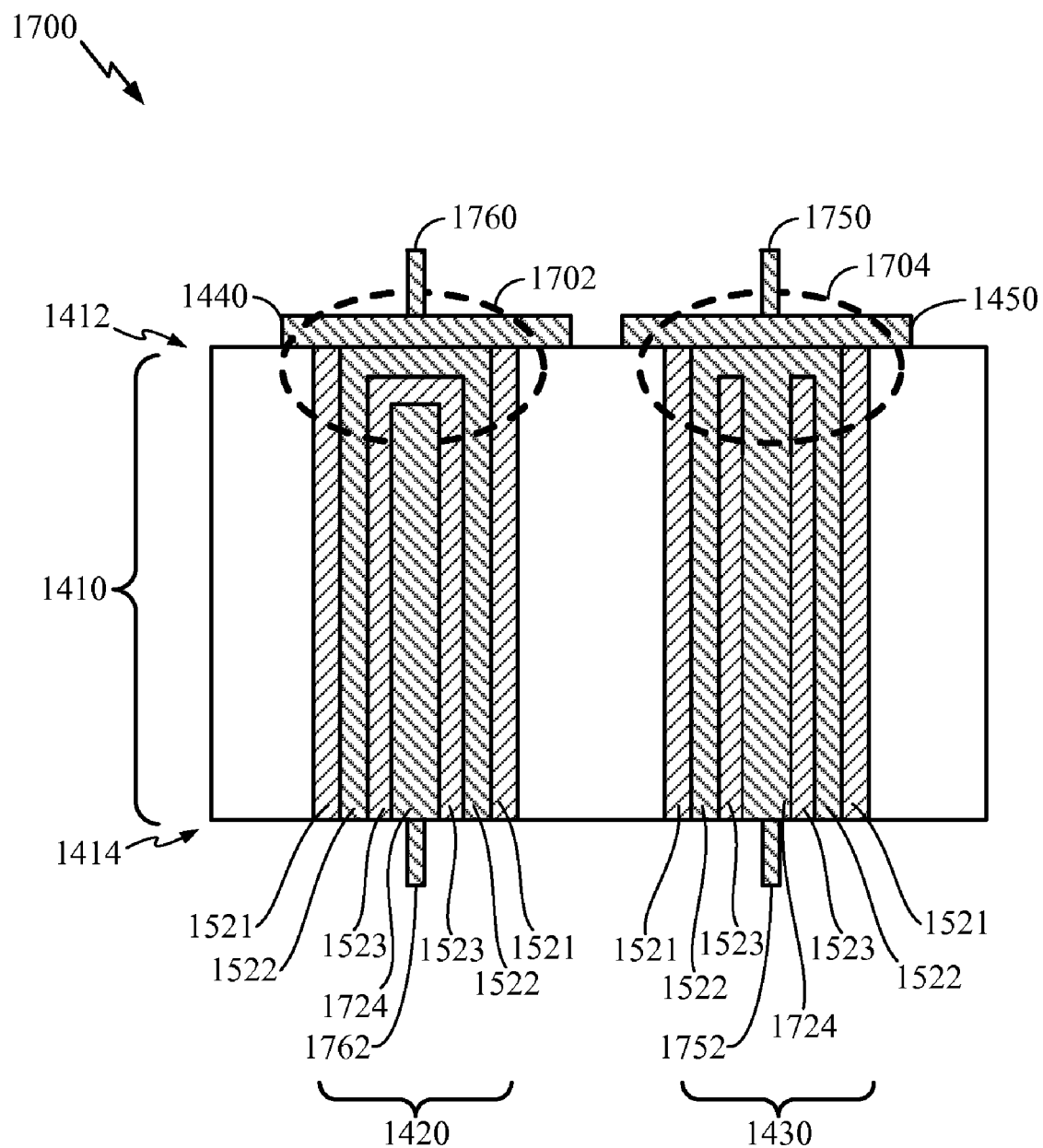
FIG. 17 is a cross section showing an exemplary die configuration after a fourth manufacturing process in a via last processing technique according to one embodiment.

Turning now to FIG. 17, an additional conductor layer is deposited. FIG. 17 is a cross section showing an exemplary die configuration after a fourth manufacturing process in a via last processing technique according to one embodiment. A second conductor layer 1724 is deposited to fill the through silicon via 1420 and the through silicon via 1430. At a region 1704, the second conductor layer 1724 couples to the contact pad 1450. A contact 1750 is coupled to the contact pad 1450, and a contact 1752 is coupled to the second conductor layer 1724. As a result, the through silicon via 1430 may be used to convey signals from the front side 1412 to the back side 1414. In contrast, at a region 1702 the second conductor layer 1724 is separated from the contact pad 1440 by the second insulator layer 1523. A contact 1760 is coupled to the contact pad 1440, and a contact 1762 is coupled to the second conductor layer 1724. As a result, the through silicon via 1420 functions as a decoupling capacitor when contact is made to the second conductor layer 1724 on the back side 1414 and to the contact pad 1440 on the front side 1412.

Figure 18:
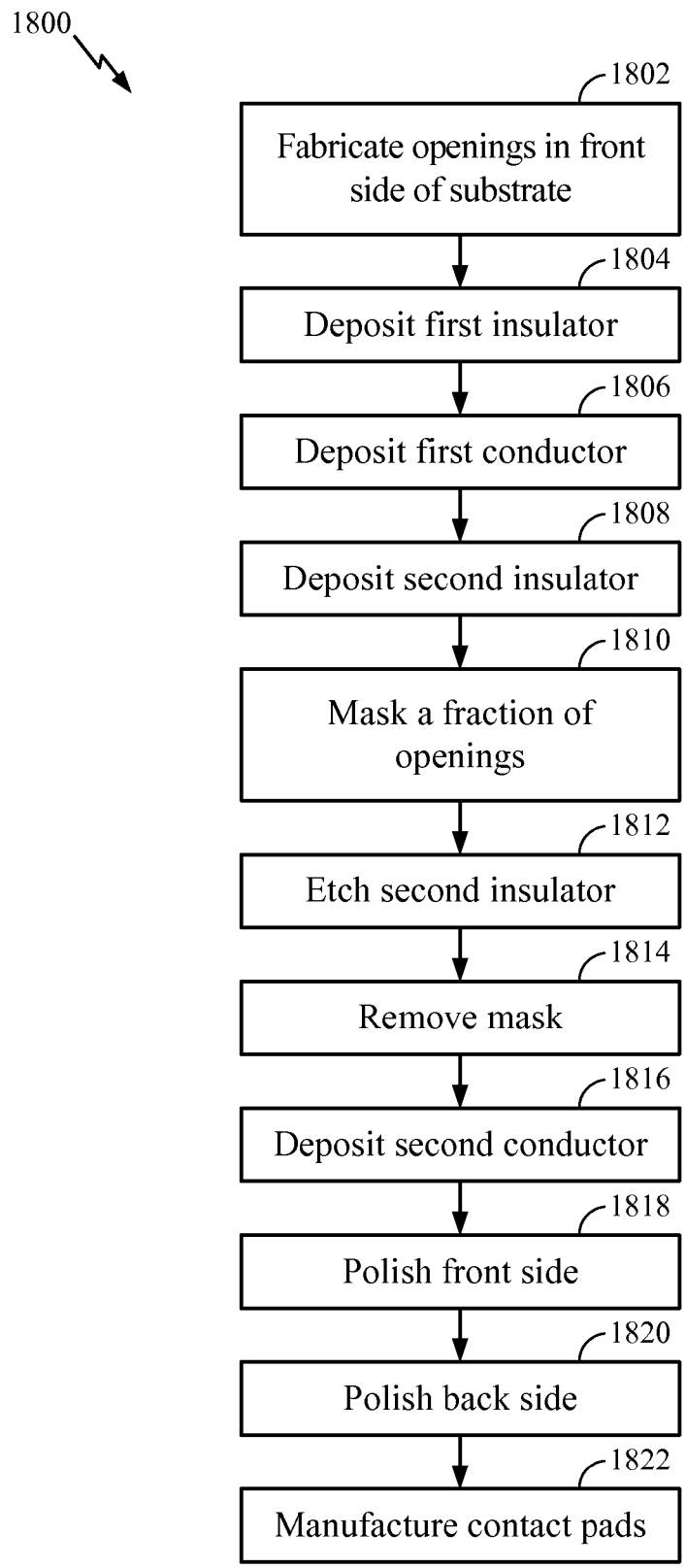
FIG. 18 is a flow diagram describing an exemplary process for manufacturing through silicon vias with embedded decoupling capacitors according to one embodiment.

Turning now to FIG. 18, an exemplary process for manufacturing openings with embedded decoupling capacitors according to one embodiment will be summarized. A routine 1800 starts at block 1802. At block 1802, openings are fabricated in the front side of the substrate. The openings may be, for example, through silicon vias. Continuing to block 1804, a first insulator is deposited, followed by, at block 1806, a first conductor, and, at block 1808, a second insulator. Following deposition, at block 1810, a fraction of the openings are masked. The openings which are masked will have embedded decoupling capacitors whereas the remaining fraction of through silicon vias will not. Continuing to block 1812, the second insulator is etched (only from those openings not masked), and then, at block 1814, the mask is removed. Next, at block 1816, a second conductor is deposited to serve as the center of the openings. At block 1818, the front side of the substrate is polished to remove sections of the deposited layers that are not contained inside the openings. At block 1820, the back side of the substrate is polished to expose the openings. Continuing to block 1822, contact pads are manufactured on the front side and the back side to contact the conducting layers deposited earlier.

Figure 19:
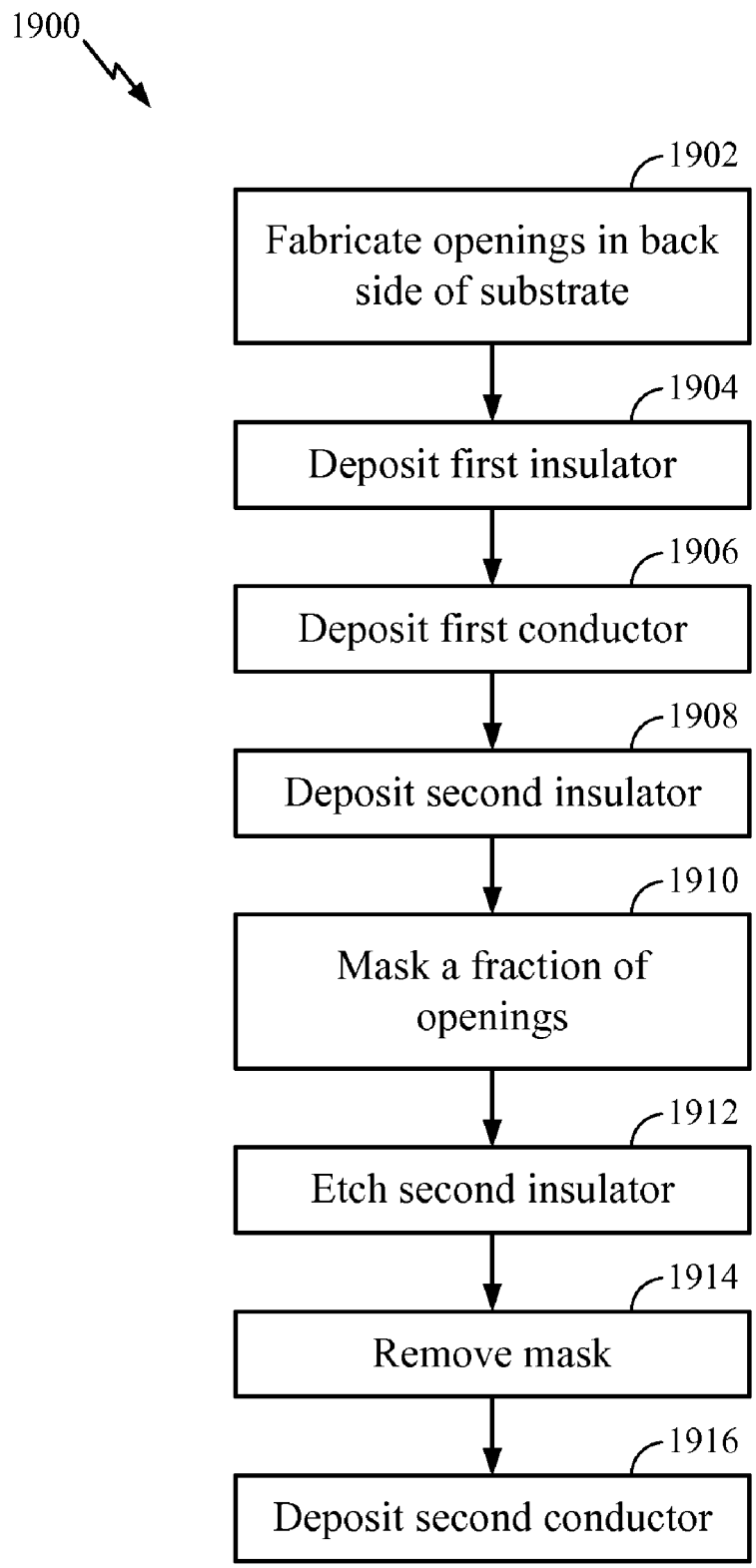
FIG. 19 is a flow diagram describing an alternative exemplary process for manufacturing through silicon vias with embedded decoupling capacitors according to one embodiment.

Turning now to FIG. 19, an alternative exemplary process for manufacturing openings with embedded decoupling capacitors according to one embodiment will be summarized. A routine 1900 starts at block 1902. At block 1902, after the substrate is thinned openings are fabricated on the back side of the substrate. Continuing to block 1904, a first insulator is deposited followed by block 1906, when a first conductor is deposited. A second insulator is deposited at block 1908. At block 1910, a fraction of the openings are masked. The fraction of openings which are masked will have embedded decoupling capacitors. Continuing to block 1912, the second insulator is etched from the openings that are not masked. A directional etch can etch the insulator from the bottom while leaving the insulator on the sidewalls to enable connectivity between the contacts and the conductor to be deposited. At block 1914, the mask is removed, and the routine 1900 proceeds to block 1916 where the second conductor is deposited.

Figure 20:
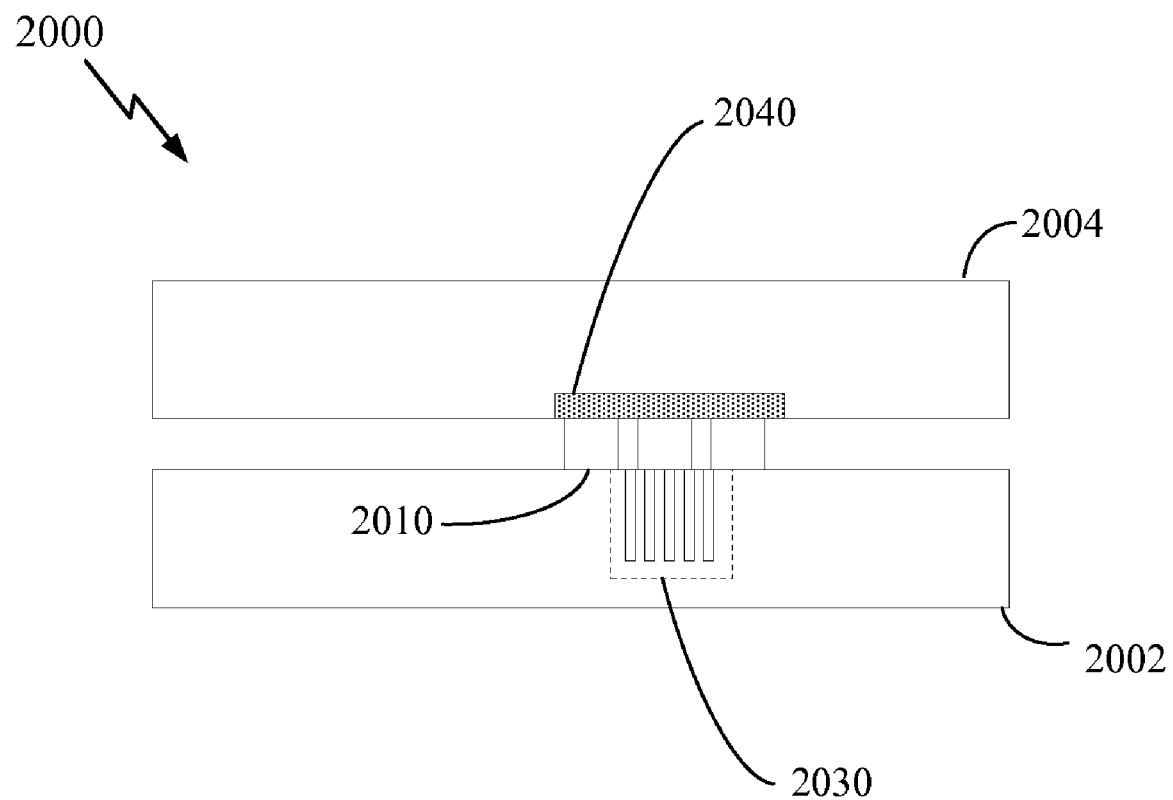
FIG. 20 is a block diagram illustrating an exemplary array of through silicon vias with embedded capacitors according to one embodiment.

FIG. 20 is a block diagram illustrating an exemplary array of through silicon vias with embedded capacitors according to one embodiment. A stacked IC device 2000 includes a first die 2002 and a second die 2004. The second die 2004 may contain a circuit 2040 such as a microprocessor for processing information. The second die 2004 is coupled to the first die 2002 through interconnects 2010. The first die 2002 may contain an array 2030 of through silicon vias with decoupling capacitors. The array 2030 may be configured to be very close to (for example, directly underneath) the microprocessor 2040 to improve the effect of the decoupling capacitors on the microprocessor 2040. Accordingly, a local supply of charge for switching activity is available to the microprocessor 2040 nearly instantaneously on demand.

Figure 21:
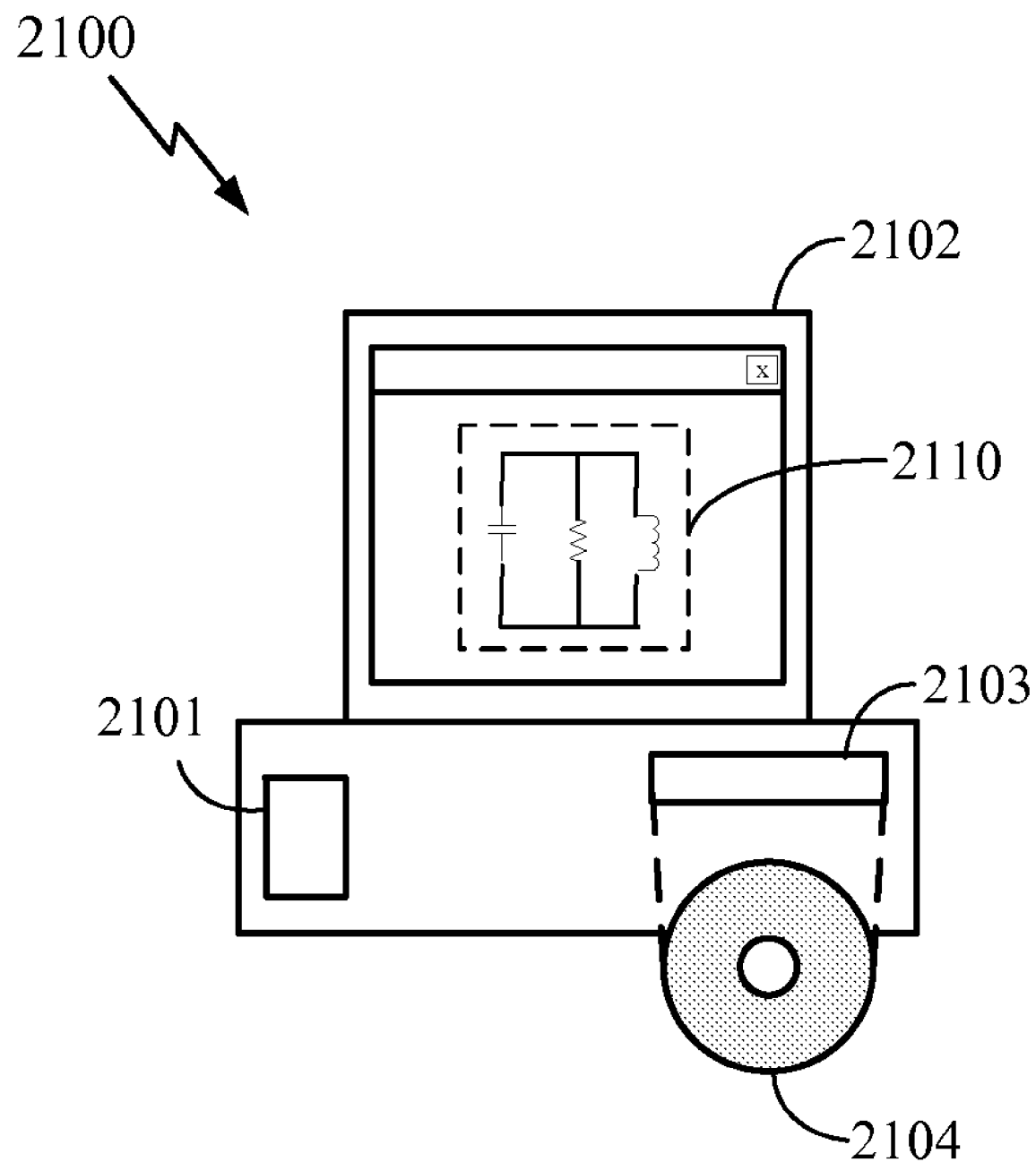
FIG. 21 is a block diagram illustrating a design workstation used for circuit, layout, and logic design of the disclosed semiconductor integrated circuit.

FIG. 21 is a block diagram illustrating a design workstation used for circuit, layout, and logic design of the disclosed semiconductor integrated circuit. A design workstation 2100 includes a hard disk 2101 containing operating system software, support files, and design software such as Cadence or OrCAD. The design workstation 2100 also includes a display to facilitate design of a circuit design 2110. The circuit design 2110 may include the circuitry as disclosed above. A storage medium 2104 is provided for tangibly storing the circuit design 2110. The circuit design 2110 may be stored on the storage medium 2104 in a file format such as GDSII or GERBER. The storage medium 2104 may be a CD-ROM, DVD, hard disk, flash memory, or other appropriate device. Furthermore, the design workstation 2100 includes a drive apparatus 2103 for accepting input from or writing output to the storage medium 2104.

Data recorded on the storage medium 2104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 2104 facilitates the design of the circuit design 2110 by decreasing the number of processes for designing semiconductor ICs.

Although only two through silicon vias have been illustrated, a stacked IC may contain many more through silicon vias. A stacked IC may contain any number of either of the two configurations of through silicon vias including exclusively using one configuration or the other.

Although the terminology "through silicon via" includes the word silicon, it is noted that through silicon vias are not necessarily constructed in silicon. Rather, the material can be any device substrate material.

Although only two coaxial conductors are described in the through silicon vias of the disclosure, minor modifications may allow additional coaxial conductors inside the through silicon vias. Multiple coaxial conductors may be used, for example, to pass multiple signals through the through silicon via or to build multiple capacitors.

Although specific processes have been conveyed through the use of the drawings and descriptions thereof, it should be understood that the through silicon via with embedded decoupling capacitor may be manufactured through alternate processes not described in this disclosure.

Although specific circuitry has been set forth, it will be appreciated by those skilled in the art that not all of the disclosed circuitry is required to practice the invention. Moreover, certain well known circuits have not been described so as to maintain focus on the invention.

Although the present invention and its advantages have been described in detail, it should be understood that various changes, substitutions, and alterations can be made herein without departing from the technology of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor die comprising:
a through substrate via extending from a front side to a back side of a substrate, the through substrate via comprising a capacitor having a first co-axial conductor, a second co-axial conductor, and a co-axial dielectric separating the first co-axial conductor from the second co-axial conductor; and
a protective insulator layer on the back side of the substrate covering the through substrate via.

2. The semiconductor die of claim 1, in which the capacitor is a decoupling capacitor.

3. The semiconductor die of claim 2, further comprising a second dielectric separating the second co-axial conductor from the substrate.

4. The semiconductor die of claim 2, in which the semiconductor die is part of a stacked IC device.

5. The semiconductor die of claim 1, in which the semiconductor die is integrated into a device, selected from the group consisting of a set top box, music player, video player, entertainment unit, navigation device, communications device, personal digital assistant (PDA), fixed location data unit, microprocessor and a computer.

6. The semiconductor die of claim 1, further comprising a third co-axial conductor outside of the second co-axial conductor and a second dielectric separating the second co-axial conductor from the third co-axial conductor.

7. A stacked IC comprising:
a first die;
a second die coupled to the first die, the second die having a through substrate via extending from a front side to a back side of a substrate, the through substrate via including a capacitor comprising,
a first co-axial conductor, a second co-axial conductor outside of the first co-axial conductor, and a first co-axial dielectric partially separating the first co-axial conductor from the second co-axial conductor; and
a protective insulator layer disposed on the back side of the substrate covering the through substrate via.

8. The stacked IC of claim 7, in which the capacitor is a decoupling capacitor.

9. The stacked IC of claim 8, further comprising a second dielectric separating the second co-axial conductor from the substrate.

10. The stacked IC of claim 8, in which the first die of the stacked IC includes logic circuitry for a microprocessor and the through substrate via is configured to provide local charge to the microprocessor.

11. The stacked IC of claim 7, in which the stacked IC is integrated into a device, selected from the group consisting of a set top box, music player, video player, entertainment unit, navigation device, communications device, personal digital assistant (PDA), fixed location data unit, microprocessor and a computer.

12. The stacked IC of claim 7, further comprising a third co-axial conductor outside of the second co-axial conductor and a second dielectric separating the second co-axial conductor from the third co-axial conductor.

13. A semiconductor die comprising:
a through substrate via extending from a front side to a back side of a substrate, the through substrate via comprising a means for storing energy, the energy storing means having a first co-axial conducting means, a second co-axial conducting means, and a means for insulating the first conducting means from the second conducting means; and
means for insulating the through substrate via, the through substrate via insulating means protecting the through substrate via, the through substrate via insulating means being disposed on the back side of the substrate and covering the through substrate via.

14. The semiconductor die of claim 13, in which the semiconductor die is integrated into at least one of a set top box, music player, video player, entertainment unit, navigation device, communications device, personal digital assistant (PDA), fixed location data unit, microprocessor and a computer.

15. A stacked IC comprising:
a first die;
a second die coupled to the first die, the second die having a through substrate via extending from a front side to a back side of a substrate, the through substrate via including a means for storing energy comprising,
first co-axial conducting means, second co-axial conducting means outside of the first conducting means, and a means for insulating the first conducting means from the second conducting means; and
means for insulating the through substrate via, the through substrate via insulating means protecting the through substrate via, the through substrate via insulating means being disposed on the back side of the substrate and covering the through substrate via.

16. The semiconductor die of claim 15, in which the semiconductor die is integrated into at least one of a set top box, music player, video player, entertainment unit, navigation device, communications device, personal digital assistant (PDA), fixed location data unit, microprocessor and a computer.

* * * * *